US012696622B2

(12) United States Patent
Oh et al.

(10) Patent No.: US 12,696,622 B2
(45) Date of Patent: Jul. 28, 2026

(54) CONDUCTIVE LAYER IN TRENCH BETWEEN PIXEL AREA AND DISPLAY APPARATUS HAVING THE SAME

(71) Applicant: Samsung Display Co., Ltd., Yongin-si (KR)

(72) Inventors: Minjeong Oh, Yongin-si (KR); Beomyeol Park, Yongin-si (KR); Kijune Lee, Yongin-si (KR); Sungeun Lee, Yongin-si (KR); Jinho Ju, Yongin-si (KR); Jonghyun Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 533 days.

(21) Appl. No.: 18/163,387

(22) Filed: Feb. 2, 2023

(65) Prior Publication Data

US 2024/0057392 A1     Feb. 15, 2024

(30) Foreign Application Priority Data

Aug. 10, 2022     (KR) ........................ 10-2022-0099995

(51) Int. Cl.
H10K 59/131     (2023.01)
H10K 59/122     (2023.01)

(52) U.S. Cl.
CPC ......... H10K 59/122 (2023.02); H10K 59/131 (2023.02)

(58) Field of Classification Search
None
See application file for complete search history.

(56) References Cited

U.S. PATENT DOCUMENTS

| | | | |
|---|---|---|---|
| 9,336,742 B2 | 5/2016 | Ahn et al. | |
| 10,056,444 B2 | 8/2018 | Cho et al. | |
| 11,177,335 B2 | 11/2021 | Park et al. | |
| 2015/0055047 A1 | 2/2015 | Chang et al. | |
| 2015/0055051 A1* | 2/2015 | Osawa | H10D 86/60 349/48 |
| 2018/0102399 A1* | 4/2018 | Cho | H10K 77/111 |
| 2019/0267440 A1* | 8/2019 | Park | G09G 3/3233 |
| 2020/0028102 A1* | 1/2020 | Kim | G09F 9/301 |

(Continued)

FOREIGN PATENT DOCUMENTS

| | | |
|---|---|---|
| CN | 112542499 A | 3/2021 |
| KR | 20160018825 A | 2/2016 |

(Continued)

*Primary Examiner* — Sue A Purvis
*Assistant Examiner* — Seyon Ali-Simah Punchbeddell
(74) *Attorney, Agent, or Firm* — CANTOR COLBURN LLP

(57)     ABSTRACT

A display apparatus includes a first pixel area and a second pixel area adjacent to each other along a first direction, a first boundary between the first pixel area and the second pixel area, a first insulating layer which is in the first and second pixel areas, a first trench which is defined in the first insulating layer and corresponds to the first boundary, a first pixel separation layer which is in the first trench, the first pixel separation layer and including a material different from a material of the first insulating layer, and a first conductive line which connects the first pixel area to the second pixel area, the first conductive line being between the first insulating layer and the first pixel separation layer.

20 Claims, 15 Drawing Sheets

(56) References Cited

U.S. PATENT DOCUMENTS

| | | | |
|---|---|---|---|
| 2020/0051964 A1* | 2/2020 | Jung | H01L 25/167 |
| 2023/0093367 A1* | 3/2023 | Baek | H10H 20/821 |
| | | | 257/13 |

FOREIGN PATENT DOCUMENTS

| | | | |
|---|---|---|---|
| KR | 1020180038606 | A | 4/2018 |
| KR | 1020190055868 | A | 5/2019 |
| KR | 20190104091 | A | 9/2019 |
| KR | 20200009899 | A | 1/2020 |
| KR | 102145391 | A | 8/2020 |
| KR | 20220047744 | A | 4/2022 |

* cited by examiner

FIG. 10

CONDUCTIVE LAYER IN TRENCH BETWEEN PIXEL AREA AND DISPLAY APPARATUS HAVING THE SAME

This application claims priority to Korean Patent Application No. 10-2022-0099995, filed on Aug. 10, 2022, in the Korean Intellectual Property Office, and all the benefits accruing therefrom under 35 U.S.C. § 119, the disclosure of which is incorporated by reference herein in its entirety.

BACKGROUND

1. Field

One or more embodiments relate to a display apparatus.

2. Description of the Related Art

The usage of display apparatuses has diversified. In addition, as display apparatuses have become thinner and lighter, their range of use has gradually been extended.

As a display apparatus is utilized variously, there may be various methods in designing the shape of the display apparatus. In addition, as the planar area occupied by a display area in display apparatuses expands, various functions other than display of an image, that are combined or associated with display apparatuses, have been added.

SUMMARY

One or more embodiments include a display apparatus of a high resolution, which is flexible and robust against an external impact.

Technical objects to be achieved by an embodiment are not limited to the technical objects mentioned above, and other technical objects that are not mentioned will be clearly understood by those of ordinary skill in the art from the description of the disclosure.

Additional aspects will be set forth in part in the description which follows and, in part, will be apparent from the description, or may be learned by practice of the presented embodiments of the disclosure.

According to one or more embodiments, a display apparatus includes a substrate in which a first pixel area and a second pixel area are defined, the first pixel area being adjacent to the second pixel area in a first direction, a first insulating layer disposed on the substrate and including a first trench corresponding to a boundary between the first pixel area and the second pixel area, a first pixel separation layer buried in the first trench and including a material different from a material of the first insulating layer, and a first conductive line having at least a portion arranged between the first insulating layer and the first pixel separation layer.

The first conductive line may extend substantially in the first direction along an upper surface of the first insulating layer and the first trench.

The display apparatus may further include a first pixel circuit arranged in the first pixel area and including a first semiconductor layer and a first gate electrode on the first semiconductor layer, and a second pixel circuit arranged in the second pixel area and including a second semiconductor layer and a second gate electrode on the second semiconductor layer, where the first insulating layer may further include a first contact hole and a second contact hole, the first contact hole exposing at least a portion of the first gate electrode, and the second contact hole exposing at least a portion of the second gate electrode, and the first conductive line may be connected to the first gate electrode through the first contact hole and connected to the second gate electrode through the second contact hole.

The display apparatus may further include a first semiconductor layer arranged in the first pixel area, and a second semiconductor layer arranged in the second pixel area, where the first insulating layer may further include a first contact hole and a second contact hole, the first contact hole exposing at least a portion of the first semiconductor layer, and the second contact hole exposing at least a portion of the second semiconductor layer, and the first conductive line may be connected to the first semiconductor layer through the first contact hole and connected to the second semiconductor layer through the second contact hole.

A lateral surface of the first insulating layer defining the first trench may have at least one step difference.

The first conductive line may extend substantially in the first direction along the at least one step difference.

The at least one step difference may include an inclined surface forming a preset angle with respect to an upper surface of the substrate.

The first insulating layer may include a first sub-insulating layer and a second sub-insulating layer, the first sub-insulating layer including a first lateral surface that defines a first portion of the first trench, the second sub-insulating layer including a second lateral surface that defines a second portion of the first trench, and the second lateral surface of the second sub-insulating layer may be located outside the first lateral surface of the first sub-insulating layer in a plan view.

A first width of the first portion of the first trench in the first direction may be less than a second width of the second portion of the first trench in the first direction.

The first lateral surface of the first sub-insulating layer may form a right angle or an acute angle with respect to an upper surface of the substrate, and the second lateral surface of the second sub-insulating layer may form a right angle or an acute angle with respect to the upper surface of the substrate.

The first insulating layer may include a first portion and a second portion, the first portion having a first thickness, and the second portion surrounding the first portion and having a second thickness greater than the first thickness.

The display apparatus may further include a first pixel circuit arranged in the first pixel area, a second pixel circuit arranged in the second pixel area, and a second conductive line having at least a portion arranged between the first insulating layer and the first pixel separation layer, where the first conductive line may extend substantially in the first direction along the first trench to transfer a first signal to the first pixel circuit and the second pixel circuit, and the second conductive line may extend substantially in the first direction along the first trench to transfer a second signal different from a first signal to the first pixel circuit and the second pixel circuit.

The first pixel circuit may include a first transistor and a third transistor, the first transistor being turned on in response to the first signal, and the third transistor being turned on in response to the second signal, the second pixel circuit may include a second transistor and a fourth transistor, the second transistor being turned on in response to the first signal, and the fourth transistor being turned on in response to the second signal, a conduction type of the first transistor may be opposite to a conduction type of the third transistor, and a conduction type of the second transistor may be opposite to a conduction type of the fourth transistor.

Each of the first, second, third and fourth transistors may have a conduction type among a p-type conduction and a n-type conduction, the conduction type of the first transistor may be different from the conduction type of the third transistor, and the conduction type of the second transistor may be different from the conduction type of the fourth transistor.

A third pixel area may be further defined in the substrate, the third pixel area being adjacent to the first pixel area in a second direction crossing the first direction, the first insulating layer may further include a second trench corresponding to a boundary between the first pixel area and the third pixel area, and the display apparatus may further include a second pixel separation layer buried in the second trench and including a material different from a material of the first insulating layer, and a second conductive line having at least a portion arranged between the first insulating layer and the second pixel separation layer.

The second conductive line may extend substantially in the second direction along an upper surface of the first insulating layer and the second trench.

A lateral surface of the first insulating layer defining the second trench may have at least one step difference.

The display apparatus may further include a second conductive line arranged between the first insulating layer and the first pixel separation layer, a first semiconductor layer arranged in the first pixel area, a second semiconductor layer arranged in the second pixel area, a third semiconductor layer arranged in the first pixel area and including a material different from a material of the first semiconductor layer, and a fourth semiconductor layer arranged in the second pixel area and including a material different from a material of the second semiconductor layer, where the first conductive line may connect the first semiconductor layer to the second semiconductor layer, and the second conductive line may connect the third semiconductor layer to the fourth semiconductor layer.

The first semiconductor layer and the second semiconductor layer may include a silicon semiconductor material, and the third semiconductor layer and the fourth semiconductor layer may include an oxide semiconductor material.

The display apparatus may further include a second insulating layer disposed on the first insulating layer, covering the first conductive line, and provided as one body with the first pixel separation layer.

The first insulating layer may include an inorganic material, and the first pixel separation layer may include an organic material.

These and/or other aspects will become apparent and more readily appreciated from the following description of the embodiments, the accompanying drawings, and claims.

These general and specific aspects may be implemented by using a system, a method, a computer program, or a combination of a certain system, method, and computer program.

BRIEF DESCRIPTION OF THE DRAWINGS

The above and other aspects, features, and advantages of embodiments of the disclosure will be more apparent from the following description taken in conjunction with the accompanying drawings, in which:

FIG. 10 is an enlarged cross-sectional view of an example of a portion of the display apparatus in FIG. 7, taken along line IV-IV' in FIG. 7;

DETAILED DESCRIPTION

Figure 1:
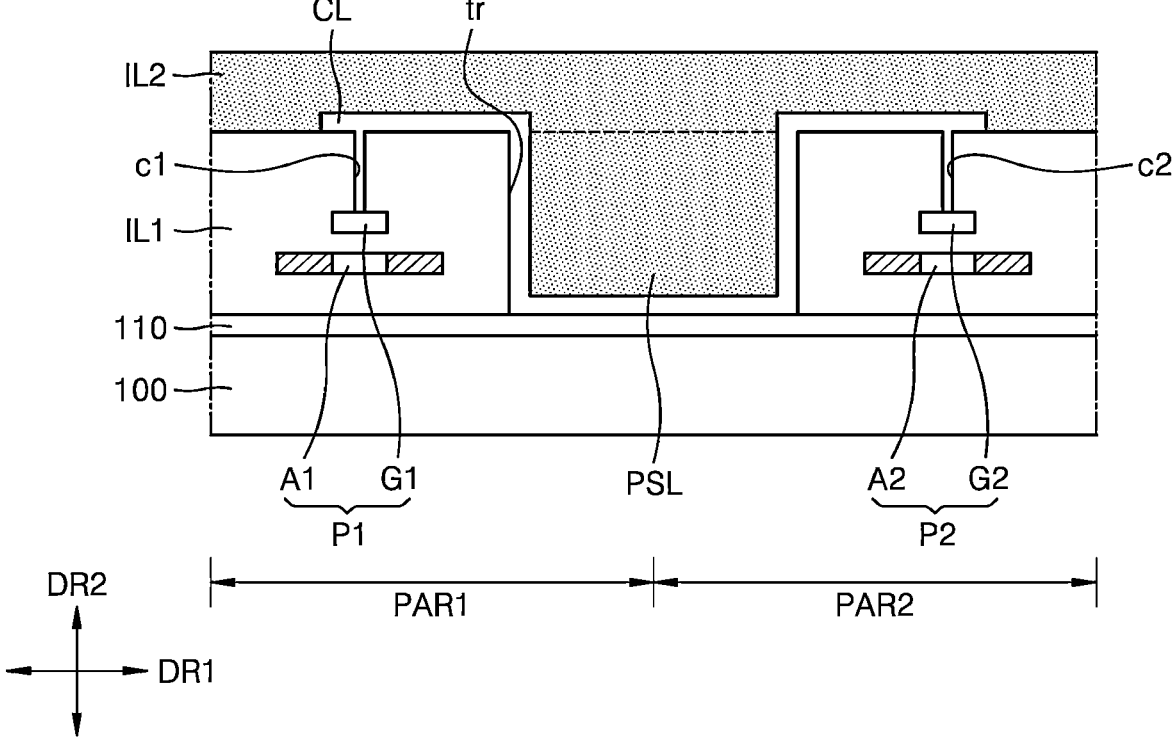
FIG. 1 is an enlarged cross-sectional view of a display apparatus according to an embodiment.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, where like reference numerals refer to like elements throughout and a repeated description thereof is omitted. For example, a reference number labeling a singular form of an element within the drawing figures may be used to reference a plurality of the singular element within the text of specification.

While such terms as "first" and "second" may be used to describe various elements, such elements must not be limited to the above terms. The above terms are used to distinguish one element from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or elements but do not preclude the addition of one or more other features or elements.

It will be further understood that, when a layer, region, or element is referred to as being related to another element such as being "on" another layer, region, or element, it can be directly or indirectly on the other layer, region, or element. That is, for example, intervening layers, regions, or elements may be present. In contrast, when a layer, region, or element is referred to as being related to another element such as being "directly on" another layer, region, or element, it can be directly or indirectly on the other layer, region, or element. That is, for example, no intervening layer, region or element is present. As being related "directly", elements may form an interface therebetween (e.g., directly contact each other), without being limited thereto.

Sizes of elements in the drawings may be exaggerated or reduced for convenience of explanation. As an example, the size and thickness of each element shown in the drawings are arbitrarily represented for convenience of description, and thus, the disclosure is not necessarily limited thereto.

In the case where a certain embodiment may be implemented differently, a specific process order may be performed in the order different from the described order. As an example, two processes successively described may be simultaneously performed substantially and performed in the opposite order.

In the present specification, "A and/or B" means A or B, or A and B. In the present specification, "at least one of A and B" means A or B, or A and B.

It will be understood that when a layer, region, or element is referred to as being related to another element such as being "connected" to another layer, region, or element, it may be "directly connected" to the other layer, region, or element or may be "indirectly connected" to the other layer, region, or element with other layer, region, or element located therebetween. For example, it will be understood that when a layer, region, or element is referred to as being "electrically connected" to another layer, region, or element, it may be "directly electrically connected" to the other layer, region, or element or may be "indirectly electrically connected" to other layer, region, or element with other layer, region, or element located therebetween. In contrast, when a layer, region, or element is referred to as being related to another element such as being "directly connected" to another layer, region, or element, no other layer, region, or element is located therebetween.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a schematic cross-sectional view of a display apparatus 1 according to an embodiment.

Referring to FIG. 1, the display apparatus 1 may include a substrate 100, a barrier layer 110, a first insulating layer IL1, a first pixel circuit P1, a second pixel circuit P2, a pixel separation layer PSL, a conductive line CL, and a second insulating layer IL2.

A first pixel area PAR1 and a second pixel area PAR2 may be defined in the substrate 100. The first pixel area PAR1 may be adjacent to the second pixel area PAR2 in (or along) a first direction DR1.

The substrate 100 may include glass or a polymer resin. The polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multi-layered structure including a layer that includes the polymer resin and an inorganic layer.

A barrier layer 110 may be disposed on the substrate 100. The barrier layer 110 may prevent or reduce the penetration of impurities from the substrate 100 and the like, to other layers of the display apparatus 1. The barrier layer 110 may include an inorganic material, an organic material, or an organic/inorganic composite material, and include a single layer or a multi-layer including an inorganic material and an organic material, the inorganic material including oxide or nitride.

The first insulating layer IL1 may be disposed on the barrier layer 110. The first insulating layer IL1 may include (or define) a trench tr corresponding to a boundary (e.g., a first boundary) between the first pixel area PAR1 and the second pixel area PAR2. The trench tr may be open to outside the first insulating layer IL1, such as open in a direction away from the substrate 100. The first insulating layer IL1 may include silicon oxide ($SiO_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO$_2$).

When an external impact is applied to the display apparatus 1, cracks may occur in the first insulating layer IL1 including an inorganic material inside the display apparatus 1. In addition, the cracks occurring in one pixel area may grow along the first insulating layer IL1 including the inorganic material inside the display apparatus 1, and extend to an adjacent pixel area. Accordingly, defects may occur in the plurality of pixels PX.

In contrast, in the case where the first insulating layer IL1 of the display apparatus 1 according to an embodiment has the trench tr corresponding to the boundary between the first pixel area PAR1 and the second pixel area PAR2, the growing of or propagating of the cracks may be effectively prevented or reduced.

The first pixel circuit P1 may be arranged in the first pixel area PAR1, and the second pixel circuit P2 may be arranged in the second pixel area PAR2. The first pixel circuit P1 and the second pixel circuit P2 may be disposed inside the first insulating layer IL1. As being inside a layer, for example, an element may be spaced apart from outer surfaces of the layer, without being limited thereto. The first pixel circuit P1 may include a first semiconductor layer A1 and a first gate electrode G1 which is on the first semiconductor layer A1, and the second pixel circuit P2 may include a second semiconductor layer A2 and a second gate electrode G2 which is on the second semiconductor layer A2.

The first semiconductor layer A1 and the second semiconductor layer A2 may include amorphous silicon or polycrystalline silicon. In another embodiment, the first semiconductor layer A1 and the second semiconductor layer A2 may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). The first semiconductor layer A1 and the second semiconductor layer A2 may include a channel region, a drain region, and a source region, the drain region and the source region respectively being on two opposite sides of the channel region. The first semiconductor layer A1 and the second semiconductor layer A2 may include a single layer or a multi-layer along a thickness direction of the display apparatus.

The first gate electrode G1 and the second gate electrode G2 may each include a conductive material such as molybdenum (Mo), aluminum (Al), copper (Cu), and titanium (Ti), and have a single-layered structure or a multi-layered structure including one or more of the above materials. As an example, the first gate electrode G1 and the second gate electrode G2 may each include a Mo single layer.

The pixel separation layer PSL may be buried in the trench tr. That is, the pixel separation layer PSL may be disposed on the first insulating layer IL1, and extend into the trench tr to be in the trench tr. As the pixel separation layer PSL is disposed inside the trench tr, a step difference of the first insulating layer IL1 occurring due to the trench tr may be removed or reduced. That is, the pixel separation layer PSL may define a flat upper surface at both the first insulating layer IL1 and at the trench tr, so as to planarize the step difference.

The pixel separation layer PSL may include a material different from a material of the first insulating layer ILL As an example, the pixel separation layer PSL may include a single layer or a multi-layer including an organic material. The pixel separation layer PSL may include a general-purpose polymer, such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

At least a portion of the conductive line CL may be arranged between the first insulating layer IL1 and the pixel separation layer PSL. The conductive line CL may extend along the upper surface of the first insulating layer IL1 and along a sidewall of the first insulating layer IL1 which defines the trench tr. As shown in FIG. 1, though the conductive line CL has a portion extending in a second direction DR2 (e.g., a thickness direction), the conductive line CL may extend substantially in the first direction DR1. As extending substantially in the first direction DR1 the conductive line CL may have a major dimension along the first direction DR1. The conductive line CL may include a conductive material including molybdenum (Mo), aluminum (Al), copper (Cu), and titanium (Ti) and have a single-layered structure or a multi-layered structure including the above materials. As an example, the conductive line CL may have a multi-layered structure of Ti/Al/Ti.

In an embodiment, the conductive line CL may connect the first pixel circuit P1 to the second pixel circuit P2. As an example, as shown in FIG. 1, the first insulating layer IL1 may include a first contact hole c1 and a second contact hole c2 defined therein, where the first contact hole c1 exposes at least a portion of the first gate electrode G1 to outside the first insulating layer IL1, and the second contact hole c2 exposes at least a portion of the second gate electrode G2 to outside the first insulating layer IL1. The conductive line CL may be connected to the first pixel circuit P1 at the first gate electrode G1 through (or at) the first contact hole c1, and connected to the second pixel circuit P2 at the second gate electrode G2 through (or at) the second contact hole c2. The conductive line CL may connect the first gate electrode G1 to the second gate electrode G2.

The second insulating layer IL2 may be disposed on the first insulating layer IL1, to cover the conductive line CL. The second insulating layer IL2 may include a single layer or a multi-layer including an organic material and provide a flat upper surface. The second insulating layer IL2 may include a general-purpose polymer, such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

In an embodiment, the second insulating layer IL2 may be provided as one body with the pixel separation layer PSL. A dotted line in FIG. 1 indicates a virtual boundary between the second insulating layer IL2 and the pixel separation layer PSL, for convenience of illustration. As being one body, the pixel separation layer PSL may extend to outside the trench tr to define the second insulating layer IL2, or the second insulating layer IL2 may extend into the trench tr to define the pixel separation layer PSL. The second insulating layer IL2 may be portions of an insulating pixel separation layer (e.g., the pixel separation layer PSL together with the second insulating layer IL2) respectively at the first insulating layer IL1 and the trench tr, and such portions may be coplanar with each other.

Figure 2:
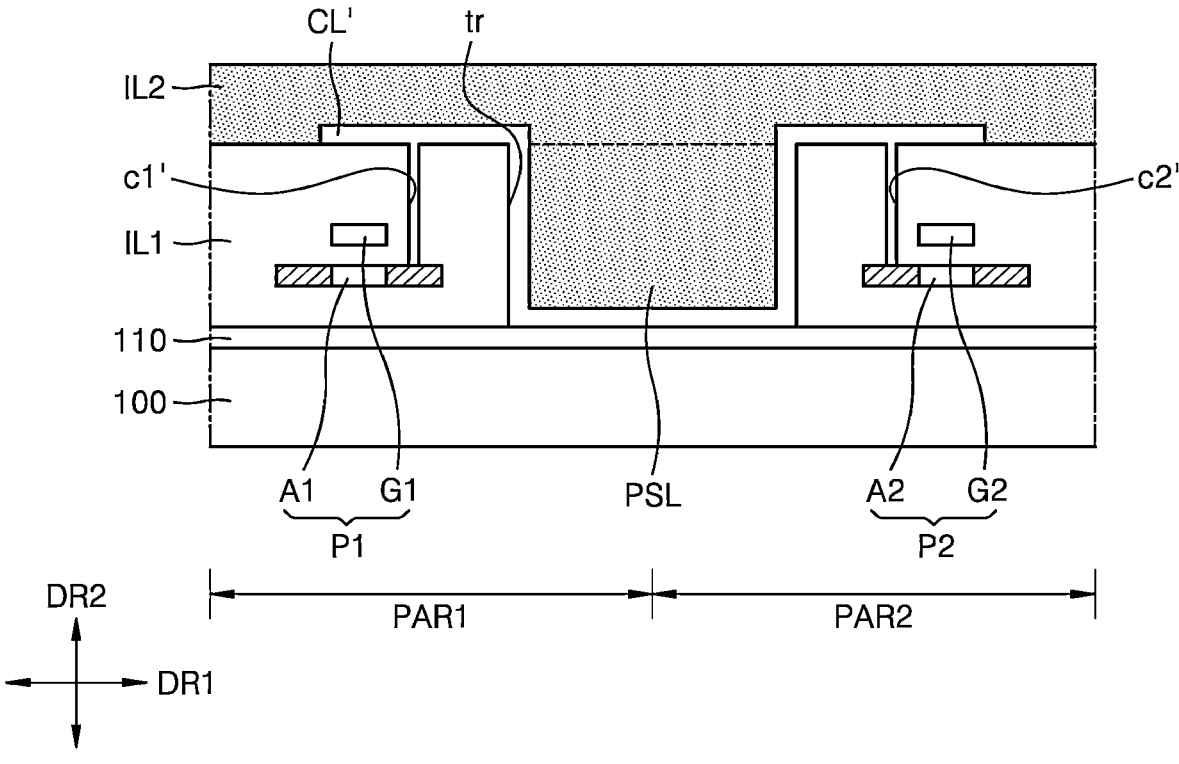
FIG. 2 is an enlarged cross-sectional view of a display apparatus according to an embodiment.

FIG. 2 is a schematic cross-sectional view of a display apparatus 1 according to an embodiment. FIG. 2 is a modified embodiment of FIG. 1 and is different from FIG. 1 in the structure of the conductive line. Hereinafter, descriptions previously given with reference to FIG. 1 are omitted, and differences are mainly described.

Referring to FIG. 2, a conductive line CL' may be arranged between the first insulating layer IL1 and the pixel separation layer PSL. The conductive line CL' may extend along the upper surface of the first insulating layer IL1 and along the sidewall of the first insulating layer IL1 which defines the trench tr. As shown in FIG. 2, though the conductive line CL' has a portion extending in the second direction DR2, the conductive line CL' may extend substantially in the first direction DR1. The conductive line CL' may include a conductive material including molybdenum (Mo), aluminum (Al), copper (Cu), and titanium (Ti) and have a single-layered structure or a multi-layered structure including the above materials. As an example, the conductive line CL' may have a multi-layered structure of Ti/Al/Ti.

In an embodiment, the conductive line CL' may connect the first pixel circuit P1 to the second pixel circuit P2. As an example, as shown in FIG. 2, the first insulating layer IL1 may include a first contact hole c1' and a second contact hole c2', where the first contact hole cl' exposes at least a portion of the first semiconductor layer A1 to outside the first insulating layer IL1, and the second contact hole c2' exposes at least a portion of the second semiconductor layer A2 to outside the first insulating layer IL1. The conductive line CL' may be connected to the first pixel circuit P1 at the first semiconductor layer A1, through the first contact hole cl', and connected to the second pixel circuit P2 at the second semiconductor layer A2, through the second contact hole c2'. The conductive line CL' may connect the first semiconductor layer A1 to the second semiconductor layer A2, that is, connect the first pixel circuit P1 to the second pixel circuit P2.

Figure 3:
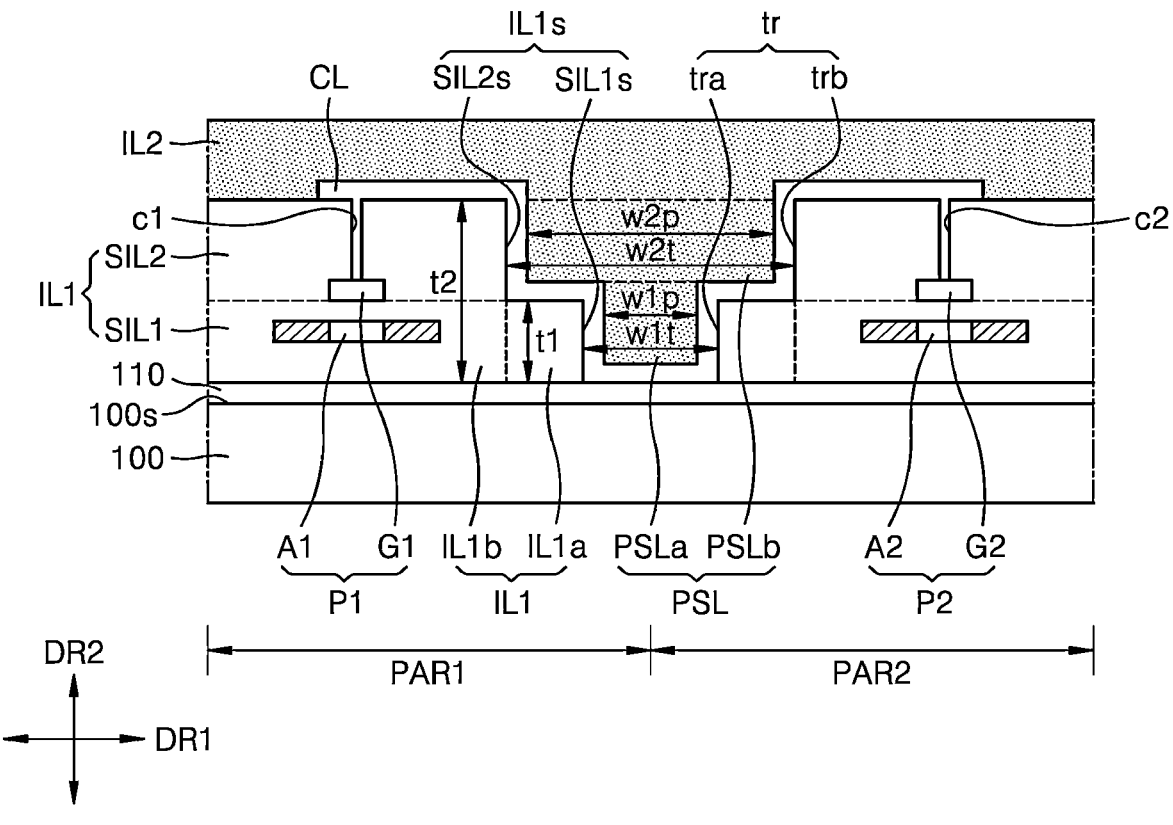
FIG. 3 is an enlarged cross-sectional view of a display apparatus according to an embodiment.

FIG. 3 is a schematic cross-sectional view of a display apparatus 1 according to an embodiment. FIG. 3 is a modified embodiment of FIG. 1 and is different from FIG. 1 in the structure of the trench tr. Hereinafter, descriptions previously given with reference to FIG. 1 are omitted, and differences are mainly described.

Referring to FIG. 3, a lateral surface IL1s of the first insulating layer IL1 defining the trench tr may include at least one step difference (e.g., a step or stepped structure). The lateral surface IL1s of the first insulating layer IL1 defining the trench tr may have a stair shape. The lateral surface IL1s may be the sidewall of the first insulating layer IL1 which defines the trench tr. The conductive line CL may extend substantially in the first direction DR1 along the at least one step difference. The conductive line CL may partially have a stair shape. In the case where the conductive line CL extends along the at least one step difference, the thickness of the conductive line CL in the second direction DR2 may be reduced. When the thickness of the conductive line CL in the second direction DR2 is reduced, the amount of the conductive line CL spreading in two opposite directions in a plan view is reduced, and thus, unintentional connection to an adjacent or different conductive material line may be prevented.

In an embodiment, the first insulating layer IL1 may include a first sub-insulating layer SIL1, and a second sub-insulating layer SIL2 which is on the first sub-insulating layer SIL1. The first sub-insulating layer SIL1 may include thickness portions of the first insulating layer IL1 which are coplanar with each other, and the second sub-insulating layer SIL2 may include thickness portions of the first insulating layer IL1 which are coplanar with each other and in a different plane than the first sub-insulating layer SIL1. The display apparatus 1 and various components or layers thereof may be disposed in a plane defined by two directions crossing each other. Referring to FIG. 3, for example, the plane may be defined by the first direction DR1 and a third direction extending into the view or page, such third direction crossing each of the first and second directions DR1 and DR2.

The first sub-insulating layer SIL1 may include a first lateral surface SIL1s defining a first portion tra (e.g., a first thickness portion) of the trench tr, and the second sub-insulating layer SIL2 may include a second lateral surface SIL2s defining a second portion trb (e.g., a second thickness portion) of the trench tr. In a plan view, the second lateral surface SIL2s of the second sub-insulating layer SIL2 may be located outside the first lateral surface SIL1s of the first sub-insulating layer SIL1. As being outside, the second lateral surface SIL2s may be further from a center of the trench tr than the first lateral surface SIL1s.

In an embodiment, an angle formed by the first lateral surface SIL1s of the first sub-insulating layer SIL1 and an upper surface 100s of the substrate 100 may be a right angle. An angle formed by the second lateral surface SIL2s of the second sub-insulating layer SIL2 and the upper surface 100s of the substrate 100 may be a right angle.

In an embodiment, a first width wt of the first portion tra of the trench tr in the first direction DR1, may be less than a second width w2t of the second portion trb of the trench tr in the first direction DR1. Such widths may be defined between sidewalls of the first sub-insulating layer SIL1 which define the trench tr. The first width wt may be a maximum width and the second width w2t may be a minimum width, without being limited thereto.

In an embodiment, the pixel separation layer PSL may include a first portion PSLa and a second portion PSLb which is on the first portion PSLa. A first width w1p of the first portion PSLa of the pixel separation layer PSL in the first direction DR1, may be less than a second width w2p of the second portion PSLb of the pixel separation layer PSL in the first direction DR1. Such widths may be defined between the sidewalls of the pixel separation layer PSL at the trench tr.

In an embodiment, the first insulating layer IL1 may include a first portion IL1a and a second portion IL1b, where the first portion IL1a has a first thickness t1 and the second portion IL1b has a second thickness t2 which is greater than the first thickness t1. The second portion IL1b of the first insulating layer IL1 may surround the first portion IL1a of the first insulating layer IL1, in a plan view (e.g., a view along the thickness direction).

Figure 4:
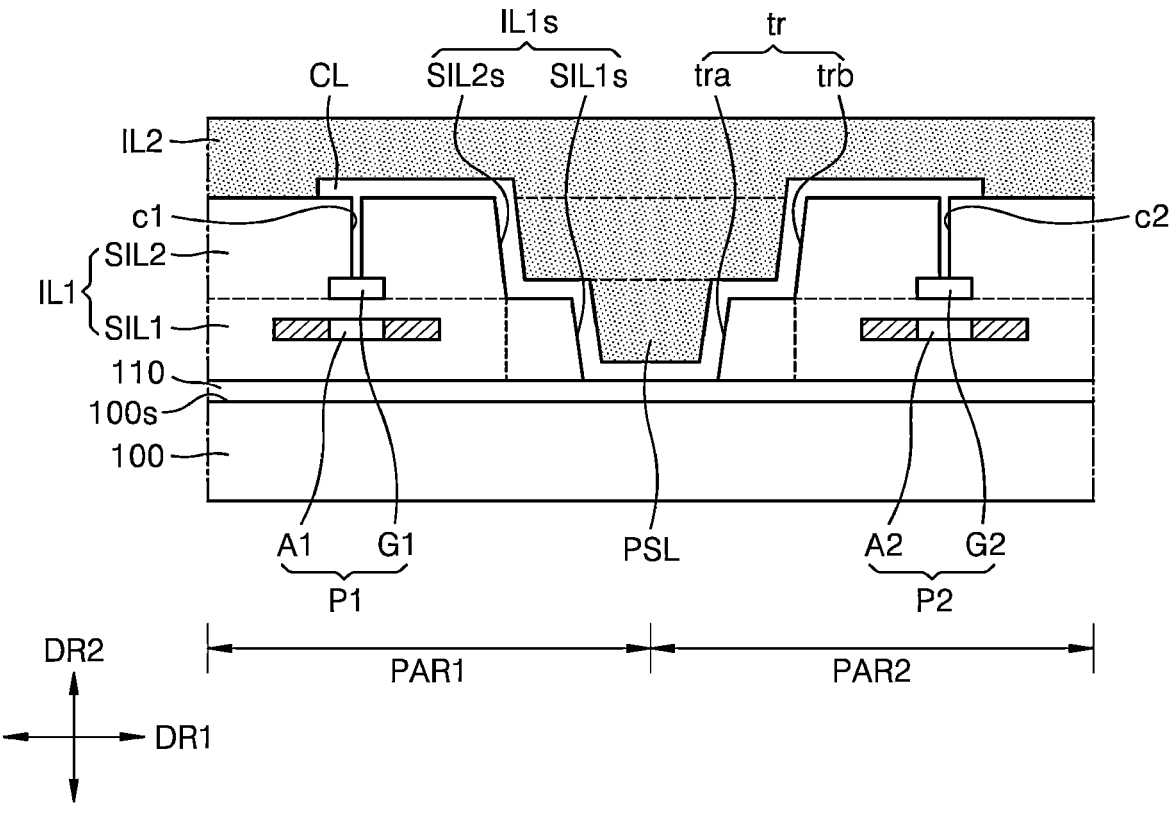
FIG. 4 is an enlarged cross-sectional view of a display apparatus according to an embodiment.

FIG. 4 is a schematic cross-sectional view of a display apparatus 1 according to an embodiment. FIG. 4 is a modified embodiment of FIG. 3 and is different from FIG. 3 in the structure of the trench. Hereinafter, descriptions previously given with reference to FIG. 3 are omitted, and differences are mainly described.

Referring to FIG. 4, the lateral surface IL1s of the first insulating layer IL1 defining the trench tr may include at least one step difference. The at least one step difference may have an inclined surface forming a preset angle with respect to the upper surface 100s of the substrate 100.

In an embodiment, an internal angle formed by the first lateral surface SIL1s of the first sub-insulating layer SIL1 and the upper surface 100s of the substrate 100, may be an acute angle. An internal angle formed by the second lateral surface SIL2s of the second sub-insulating layer SIL2 and the upper surface 100s of the substrate 100 may be an acute angle.

Figure 5:
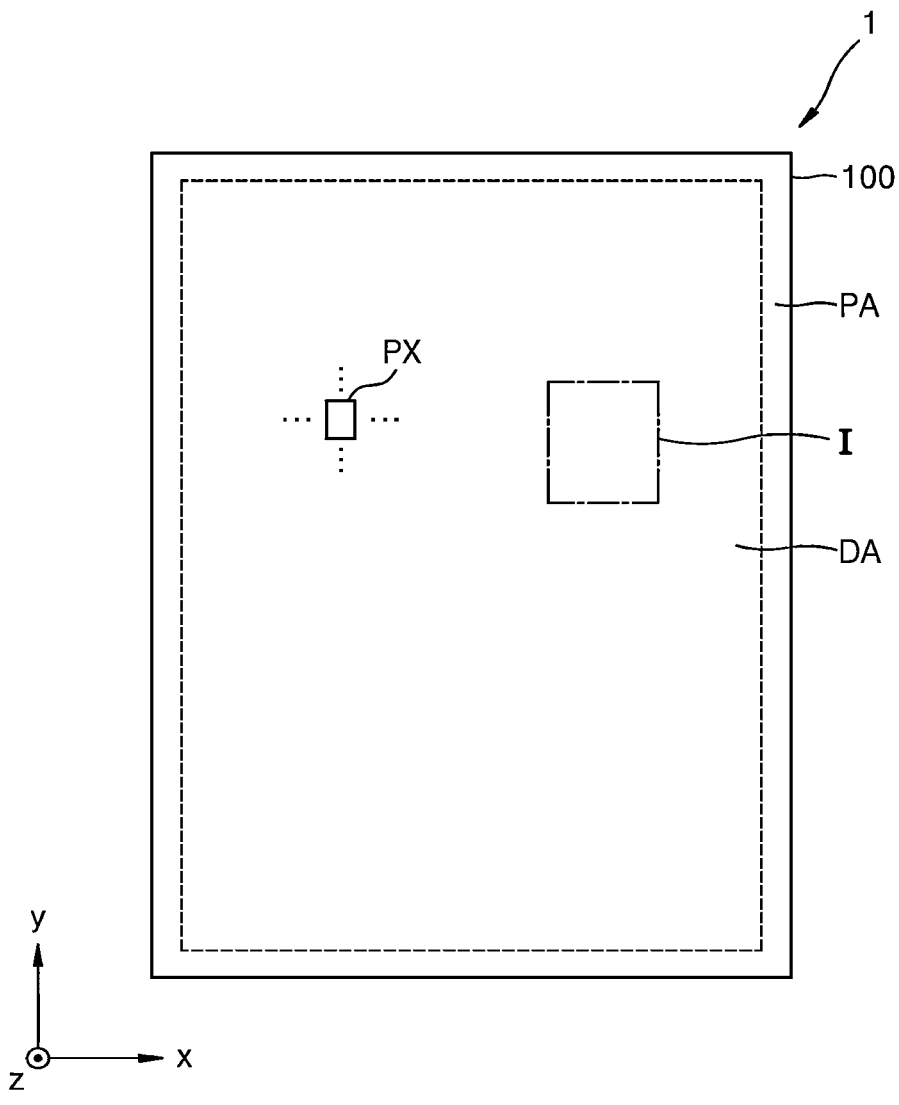
FIG. 5 is a schematic plan view of a display apparatus according to an embodiment.

FIG. 5 is a schematic plan view of the display apparatus 1 according to an embodiment.

Referring to FIG. 5, the display apparatus 1 may include a display area DA and a peripheral area PA, where the display area DA is configured to display images, and the peripheral area PA surrounds at least a portion of the display area DA. The display apparatus 1 may display images to the outside of the display apparatus 1, by using light emitted from the display area DA. Since the display apparatus 1 includes the substrate 100, it may be understood that the substrate 100 includes the display area DA and the peripheral area PA. In other words, it may be understood that the display area DA and the peripheral area PA are defined in the substrate 100. Various components and elements of the display apparatus 1 may include a display area DA and a peripheral area PA corresponding to those described above.

The substrate 100 may include various materials, such as glass, metal, or plastic. In an embodiment, the substrate 100 may include a flexible material. Here, the flexible material denotes a material that is easily warped, bendable, foldable, or rollable. The substrate 100 of the flexible material may include ultra-thin glass, metal, or plastic.

As shown in FIG. 5, the display area DA may be rectangular in a plan view (e.g., have a rectangular planar shape). In another embodiment, the display area DA may be provided in a polygonal shape, such as a triangle, a pentagon, a hexagon, and the like, a circular shape, an elliptical shape, an irregular shape, or the like.

Pixels PX including various display elements, such as an organic light-emitting diode OLED, may be arranged in the display area DA of the substrate 100. The pixel PX may be provided in plurality. The plurality of pixels PX may be arranged in various configurations such as a stripe configuration, a pentile configuration, a mosaic configuration, and the like to display images. Hereinafter, in the present specification, each pixel PX denotes a sub-pixel configured to emit light of a different color. Each pixel PX may be, for example, one of a red sub-pixel, a green sub-pixel, and a blue sub-pixel.

Though an organic light-emitting display apparatus is described as an example of the display apparatus 1 according to an embodiment, the display apparatus 1 according to an embodiment is not limited thereto. In another embodiment, the display apparatus 1 according to an embodiment may be an inorganic light-emitting display apparatus or a quantum-dot light-emitting display apparatus. As an example, an emission layer of a display element of a display apparatus 1 may include an organic material, an inorganic material, quantum dots, an organic material and quantum dots, inorganic material and quantum dots, or an organic material, an inorganic material, and quantum dots.

The peripheral area PA of the substrate 100 is a region arranged adjacent to the display area DA, such as being extended around the display area DA, and may be a region in which images are not displayed (e.g., a non-display areas). Pads or terminals through which electrical signals are transmitted, may be arranged in the peripheral area PA. Various wirings, a printed circuit board or a driver integrated circuit (IC) chip configured to transfer electric signals to the display area DA, are attached to the pads.

Figure 6:
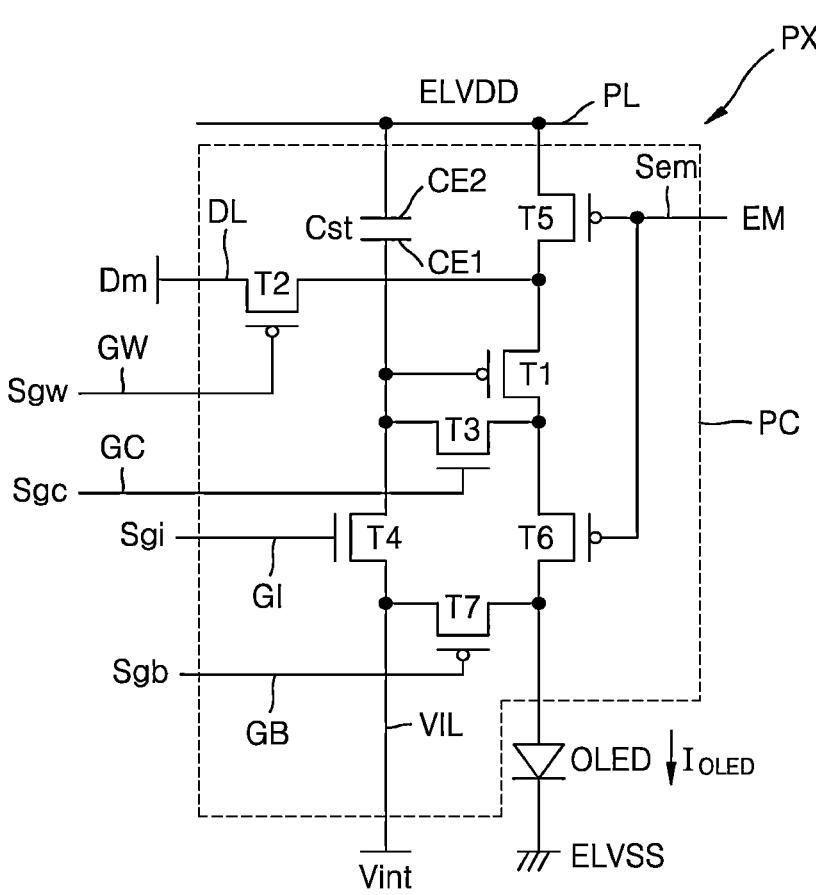
FIG. 6 is an equivalent circuit diagram of a pixel included in the display apparatus of FIG. 5.

FIG. 6 is an equivalent circuit diagram of a pixel PX included in the display apparatus 1 of FIG. 5.

Referring to FIG. 6, a pixel PX may include a pixel circuit PC and a display element which is electrically connected to the pixel circuit PC. As an example, the display element may be an organic light-emitting diode OLED. A cathode of the display element may be a common electrode to which a common voltage ELVSS is applied. The pixel circuit PC may include the first pixel circuit P1 and/or the second pixel circuit P2 described above. That is, the first pixel circuit P1 and/or the second pixel circuit P2 shown in FIGS. 1 to 4 may be disposed in the display area DA of the display apparatus 1.

As shown in FIG. 6, the pixel circuit PC may include a plurality of thin-film transistors T1, T2, T3, T4, T5, T6, and T7 and a storage capacitor Cst. The plurality of thin-film transistors T1, T2, T3, T4, T5, T6, and T7 and the storage capacitor Cst may be connected to signal lines GW, GC, GI, GB, EM, and DL, an initialization voltage line VIL, and a driving voltage line PL. In an embodiment, at least one of the signal lines GW, GC, GI, GB, EM, and DL, the initialization voltage line VIL, and/or the driving voltage line PL may be shared by pixels PX adjacent to each other.

The thin-film transistors T1, T2, T3, T4, T5, T6, and T7 may include a driving thin-film transistor T1, a scan thin-film transistor T2, a compensation thin-film transistor T3, a gate initialization thin-film transistor T4, an operation control thin-film transistor T5, an emission control thin-film transistor T6, and an anode initialization thin-film transistor T7.

Some of the plurality of thin-film transistors T1, T2, T3, T4, T5, T6, and T7 may be n-channel metal-oxide semiconductor (NMOS) field-effect transistors (n-channel MOS-FETs), and the rest may be p-channel metal-oxide semiconductor (PMOS) field-effect transistors (p-channel MOSFETs).

As an example, as shown in FIG. 6, among the plurality of thin-film transistors T1, T2, T3, T4, T5, T6, and T7, the compensation thin-film transistor T3 and the first initialization thin-film transistor T4 may be n-channel MOSFETs (NMOS), and the rest may be p-channel MOSFETs (PMOS).

As another example, among the plurality of thin-film transistors T1, T2, T3, T4, T5, T6, and T7, the compensation thin-film transistor T3, the gate initialization thin-film transistor T4, and the anode initialization thin-film transistor T7 may be n-channel MOSFETs (NMOS), and the rest may be p-channel MOSFETs (PMOS). Alternatively, only one of the plurality of thin-film transistors T1, T2, T3, T4, T5, T6, and T7 may be n-NMOS and the rest may be PMOS. Alternatively, all of the plurality of thin-film transistors T1, T2, T3, T4, T5, T6, and T7 may be NMOS.

The signal lines GW, GC, GI, GB, EM, and DL include a scan line GW configured to transfer a scan signal Sgw, a compensation gate line GC configured to transfer a compensation signal Sgc, an initialization gate line GI configured to transfer an initialization signal Sgi to the gate initialization thin-film transistor T4, an emission control line EM configured to transfer an emission control signal Sem to the operation control thin-film transistor T5 and the emission control thin-film transistor T6, a next scan line GB configured to transfer a next scan signal Sgb to the anode initialization thin-film transistor T7, and the data line DL crossing the scan line GW and configured to transfer a data signal Dm.

The driving voltage line PL is configured to transfer a driving voltage ELVDD to the driving thin-film transistor T1, and the initialization voltage line VIL is configured to transfer an initialization voltage Vint initializing the gate of the driving thin-film transistor T1 and the anode of the display element.

The gate of the driving thin-film transistor T1 is connected to the storage capacitor Cst, a source of the driving thin-film transistor T1 is connected to the driving voltage line PL through the operation control thin-film transistor T5, and a drain of the driving thin-film transistor T1 is electrically connected to the anode of the organic light-emitting diode OLED, through the emission control thin-film transistor T6. The driving thin-film transistor T1 is configured to receive a data signal Dm and supply a driving current $I_{OLED}$ to the organic light-emitting diode OLED, according to a switching operation of the scan thin-film transistor T2.

A gate of the scan thin-film transistor T2 is connected to the scan line GW, a source of the scan thin-film transistor T2 is connected to the data line DL, and a drain of the scan thin-film transistor T2 is connected to the source of the driving thin-film transistor T1 and connected to the driving voltage line PL through the operation control thin-film transistor T5. The scan thin-film transistor T2 is turned on according to a scan signal Sgw transferred through the scan line GW and performs a switching operation of transferring a data voltage Dm to the source of the driving thin-film transistor T1, where the data signal Dm is transferred to the data line DL.

A gate of the compensation thin-film transistor T3 is connected to a compensation gate line GC. A drain of the compensation thin-film transistor T3 is connected to the drain of the driving thin-film transistor T1 and connected to the anode of the organic light-emitting diode OLED, through the emission control thin-film transistor T6. A source of the compensation thin-film transistor T3 is connected to a lower electrode CE1 of the storage capacitor Cst and the gate of the driving thin-film transistor T1. In addition, the source of the compensation thin-film transistor T3 is connected to a drain of the gate initialization thin-film transistor T4. The compensation thin-film transistor T3 is turned on according to a compensation signal Sgc transferred through the compensation gate line GC, and diode-connects the driving thin-film transistor T1 by electrically connecting the gate of the driving thin-film transistor T1 to the drain of the driving thin-film transistor T1.

A gate of the gate initialization thin-film transistor T4 is connected to the initialization gate line GI. A source of the gate initialization thin-film transistor T4 is connected to a source of the anode initialization thin-film transistor T7 and the initialization voltage line VIL. A drain of the gate initialization thin-film transistor T4 is connected to the lower electrode CE1 of the storage capacitor Cst, the source of the compensation thin-film transistor T3, and the gate of the driving thin-film transistor T1. The gate initialization thin-film transistor T4 is turned on according to an initialization signal Sgi transferred through the initialization gate line GI and performs an initialization operation of initializing a voltage of the gate of the driving thin-film transistor T1 by transferring the initialization voltage Vint to the gate of the driving thin-film transistor T1.

A gate of the operation control thin-film transistor T5 is connected to the emission control line EM, a source of the operation control thin-film transistor T5 is connected to the driving voltage line PL, and a drain of the operation control thin-film transistor T5 is connected to the source of the driving thin-film transistor T1 and the drain of the scan thin-film transistor T2.

A gate of the emission control thin-film transistor T6 is connected to the emission control line EM, a source of the emission control thin-film transistor T6 is connected to the drain of the driving thin-film transistor T1 and the drain of the compensation thin-film transistor T3, and a drain of the emission control thin-film transistor T6 is electrically connected to a drain of the anode initialization thin-film transistor T7 and the anode of the organic light-emitting diode OLED.

The operation control thin-film transistor T5 and the emission control thin-film transistor T6 are simultaneously turned on according to an emission control signal Sem transferred through the emission control line EM, and the driving voltage ELVDD is transferred to the organic light-emitting diode OLED, and thus, the driving current $I_{OLED}$ flows through the organic light-emitting diode OLED.

A gate of the anode initialization thin-film transistor T7 is connected to the next scan line GB, a drain of the anode initialization thin-film transistor T7 is connected to the drain of the emission control thin-film transistor T6 and the anode of the organic light-emitting diode OLED, and a source of the anode initialization thin-film transistor T7 is connected to the source of the gate initialization thin-film transistor T4 and the initialization voltage line VIL. The anode initialization thin-film transistor T7 is turned on according to a next scan signal Sgb transferred through the next scan line GB and initializes the anode of the organic light-emitting diode OLED.

A next scan signal Sgb may be substantially synchronized with a scan signal Sgw. As another example, a next scan signal Sgb may be substantially synchronized with a scan signal Sgw on a next row. As an example, a next scan line GB may be substantially the same as a scan line GW on a next row. The pixels PX adjacent to each other in a column direction may share a same one of the scan line GW.

The anode initialization thin-film transistor T7 may be connected to the next scan line GB as shown in FIG. 6. In another embodiment, the anode initialization thin-film transistor T7 may be connected to the emission control line EM and driven according to an emission control signal Sem. The positions of a source and a drain of each of the thin-film transistors may be exchanged depending on the type (a p-type or an n-type) of the transistor.

The storage capacitor Cst may include the lower electrode CE1 and an upper electrode CE2. The lower electrode CE1 of the storage capacitor Cst is connected to the gate of the driving thin-film transistor T1, and the upper electrode CE2 of the storage capacitor Cst is connected to the driving voltage line PL. The storage capacitor Cst may be configured to store charge (e.g., electrical charge) corresponding to a difference between the gate voltage of the driving thin-film transistor T1 and the driving voltage ELVDD.

Though not shown in FIG. 6, the pixel circuit PC may include a boost capacitor including a first capacitor electrode and a second capacitor electrode. The first capacitor electrode of the boost capacitor may be connected to the gate of the scan thin-film transistor T2 and the scan line GW, and the second capacitor electrode may be connected to the source of the compensation thin-film transistor T3.

A specific operation of each pixel PX according to an embodiment is described below.

During an initialization period, when an initialization signal Sgi is supplied through the initialization gate line GI, the gate initialization thin-film transistor T4 is turned on according to the initialization signal Sgi, and the driving thin-film transistor T1 is initialized by the initialization voltage Vint supplied from the initialization voltage line VIL.

During a data programming period, when a scan signal Sgw and a compensation signal Sgc are respectively supplied through the scan line GW and the compensation gate line GC, the scan thin-film transistor T2 and the compensation thin-film transistor T3 are turned on according to a scan signal Sgw and a compensation signal Sgc. In this case, the driving thin-film transistor T1 is diode-connected and forward-biased by the compensation thin-film transistor T3 that is turned on.

Then, a compensation voltage Dm+Vth (Vth has a-value) is applied to the gate of the driving thin-film transistor T1, where the compensation voltage Dm+Vth is a voltage reduced by a threshold voltage Vth of the driving thin-film transistor T1 from a data signal Dm supplied from the data line DL.

The driving voltage ELVDD and the compensation voltage Dm+Vth are respectively applied to two opposite ends of the storage capacitor Cst, and charge corresponding to a difference between voltages of the two opposite ends is stored in the storage capacitor Cst.

During an emission period, the operation control thin-film transistor T5 and the emission control thin-film transistor T6 are turned on according to an emission control signal Sem supplied from the emission control line EM. The driving current $I_{OLED}$ corresponding to a voltage difference between the gate voltage of the driving thin-film transistor T1 and the driving voltage ELVDD occurs, and the driving current $I_{OLED}$ is supplied to the organic light-emitting diode OLED through the emission control thin-film transistor T6.

In the present embodiment, at least one of the plurality of thin-film transistors T1, T2, T3, T4, T5, T6, and T7 may include a semiconductor layer including oxide, and the rest may include a semiconductor layer including silicon.

Specifically, the driving thin-film transistor T1 directly influencing the brightness of the display apparatus 1 may be configured to include a semiconductor layer including polycrystalline silicon having high reliability. Thus, a high-resolution display apparatus may be implemented through this configuration.

Since an oxide semiconductor has high carrier mobility and a low leakage current, a voltage drop is not large even when a driving time of the respective transistor (or the display apparatus 1) is long. That is, since a color change of an image according to a voltage drop is not large even while the display apparatus 1 is driven in low frequencies, the display apparatus 1 may be driven in low frequencies.

Since the oxide semiconductor has an advantage of a low leakage current, at least one of the compensation thin-film transistor T3, the gate initialization thin-film transistor T4, and the anode initialization thin-film transistor T7 connected to the gate of the driving thin-film transistor T1 may include an oxide semiconductor. Thus, a leakage current that may flow to the gate of the driving thin-film transistor T1 may be prevented, and simultaneously, power consumption may be reduced.

Figure 7:
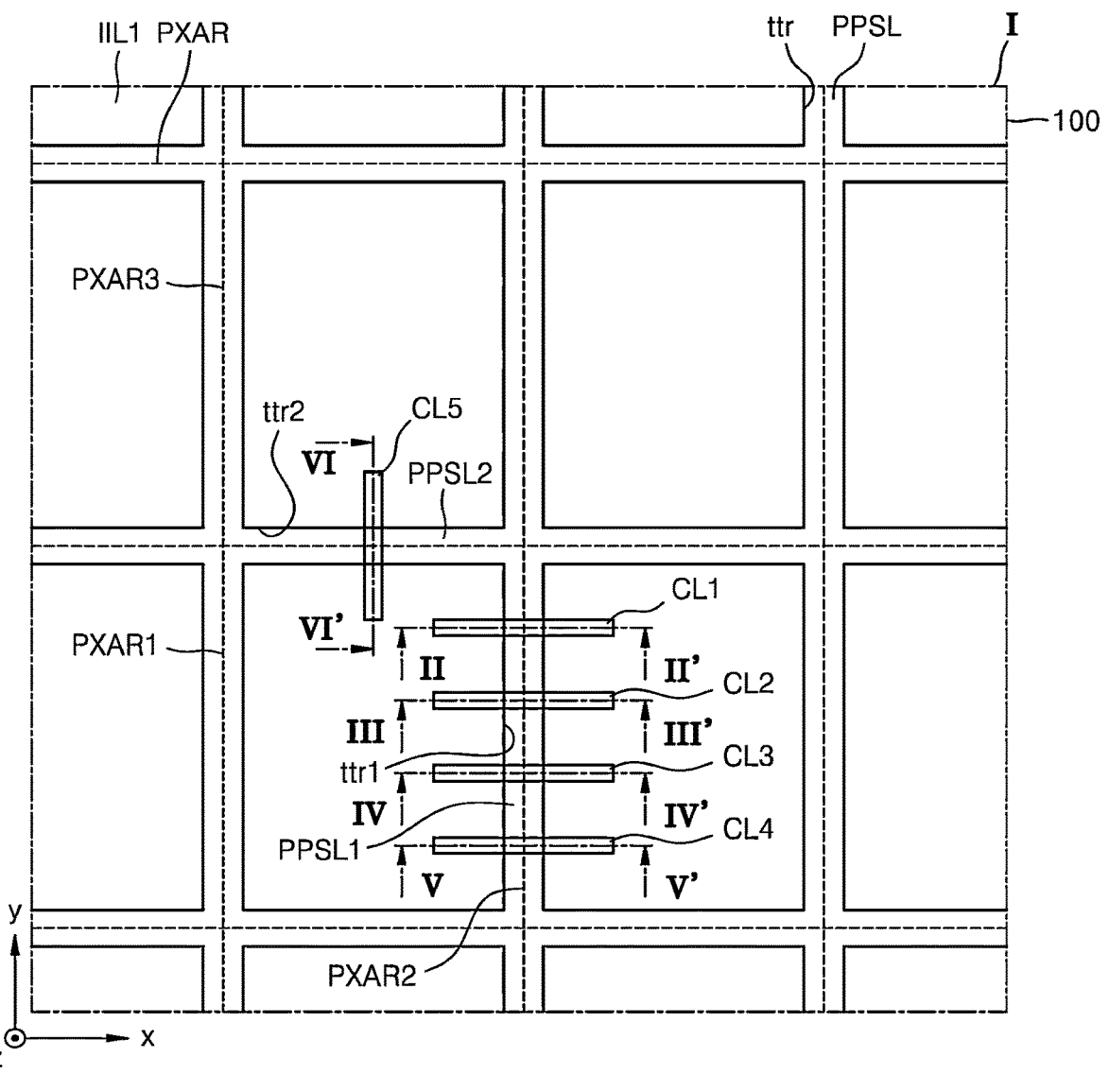
FIG. 7 is an enlarged plan view of an example of region I in FIG. 5.

FIG. 7 is an enlarged plan view of an example of region I in FIG. 5.

Referring to FIG. 7, the display apparatus 1 may include the substrate 100, a first insulating layer IIL1, a pixel separation layer PPSL, and the first to fifth conductive lines CL1, CL2, CL3, CL4, and CL5. The first to fourth conductive lines CL1, CL2, CL3 and CL4 may be in order, along the boundary between respective pixel areas.

The substrate 100 may include glass or a polymer resin. A pixel area PXAR provided in plural including a plurality of pixel areas PXAR, may be defined in the substrate 100, where the plurality of pixel areas PXAR are arranged in a first direction (e.g., a ±x direction) and a second direction (e.g., a ±y direction). As an example, a first pixel area PXAR1 may be adjacent to a second pixel area PXAR2 in (or along) the first direction (e.g., a ±x direction), and the first pixel area PXAR1 may be adjacent to a third pixel area PXAR3 in the second direction (e.g., a ±y direction). Referring to FIG. 7, the display apparatus 1 may be disposed in a plane defined by ±x direction and ±y direction crossing each other, while a thickness direction crosses each of these direction (e.g., a ±z direction). Characteristics and structures of the various pixel areas in FIG. 7 may be applied to the various pixel areas in FIGS. 1 to 4, and vice-versa, without being limited thereto.

Figure 8:
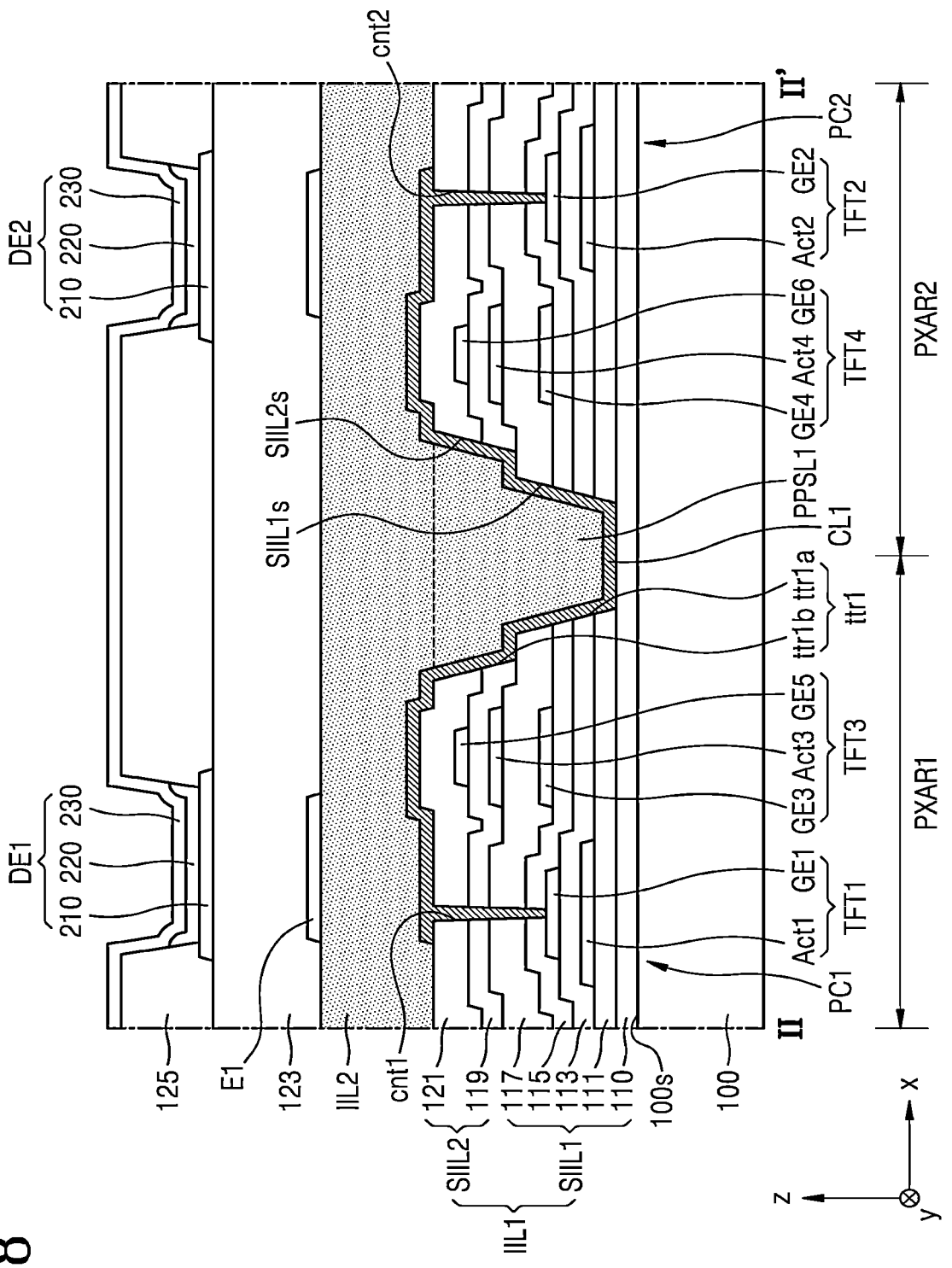
FIG. 8 is an enlarged cross-sectional view of an example of a portion of the display apparatus in FIG. 7, taken along line II-II' in FIG. 7.

The first insulating layer IIL1 may be disposed on the substrate 100 as shown in FIG. 8 described below. The first insulating layer IIL1 may include an inorganic material. The first insulating layer IIL1 may include a trench ttr corresponding to a boundary between the pixel areas PXAR. As an example, the first insulating layer IIL1 may include a first trench ttr1 and a second trench ttr2, the first trench ttr1 corresponding to a boundary between the first pixel area PXAR1 and the second pixel area PXAR2, and the second trench ttr2 corresponding to a boundary (e.g., a second boundary) between the first pixel area PXAR1 and the third pixel area PXAR3.

The pixel separation layer PPSL may fill the trench ttr of the first insulating layer IIL1. As an example, a first pixel separation layer PPSL1 may be buried in the first trench ttr1 of the first insulating layer IIL1, and a second pixel separation layer PPSL2 may be buried in the second trench ttr2 of the first insulating layer IIL1. As the pixel separation layer PPSL is disposed inside the trench ttr, a step difference of the first insulating layer IIL1 occurring due to the trench ttr may be removed or reduced. The pixel separation layer PPSL may include a material different from a material of the first insulating layer IIL1. As an example, the pixel separation layer PPSL may include an organic material.

At least a portion of the first to fifth conductive lines CL1, CL2, CL3, CL4, and CL5 may be arranged between the first insulating layer IIL1 and the pixel separation layer PPSL as shown in FIGS. 8 to 12 described below. The first to fifth conductive lines CL1, CL2, CL3, CL4, and CL5 may extend along the upper surface of the first insulating layer IIL1 which is adjacent to the trench ttr and along sidewalls of the first insulating layer IIL1 which define the trench ttr. As an example, at least a portion of the first to fourth conductive lines CL1, CL2, CL3, and CL4 may be arranged between the first insulating layer IIL1 and the first pixel separation layer PPSL1. The first to fourth conductive lines CL1, CL2, CL3, and CL4 may extend substantially in the first direction (e.g., the ±x direction) along the upper surface of the first insulating layer IIL1 and the first trench ttr1. At least a portion of the fifth conductive line CL5 may be arranged between the first insulating layer IIL1 and the second pixel separation layer PPSL2. The fifth conductive line CL5 may extend substantially in the second direction (e.g., the ±y direction) along the upper surface of the first insulating layer IIL1 and the second trench ttr2.

Figure 9:
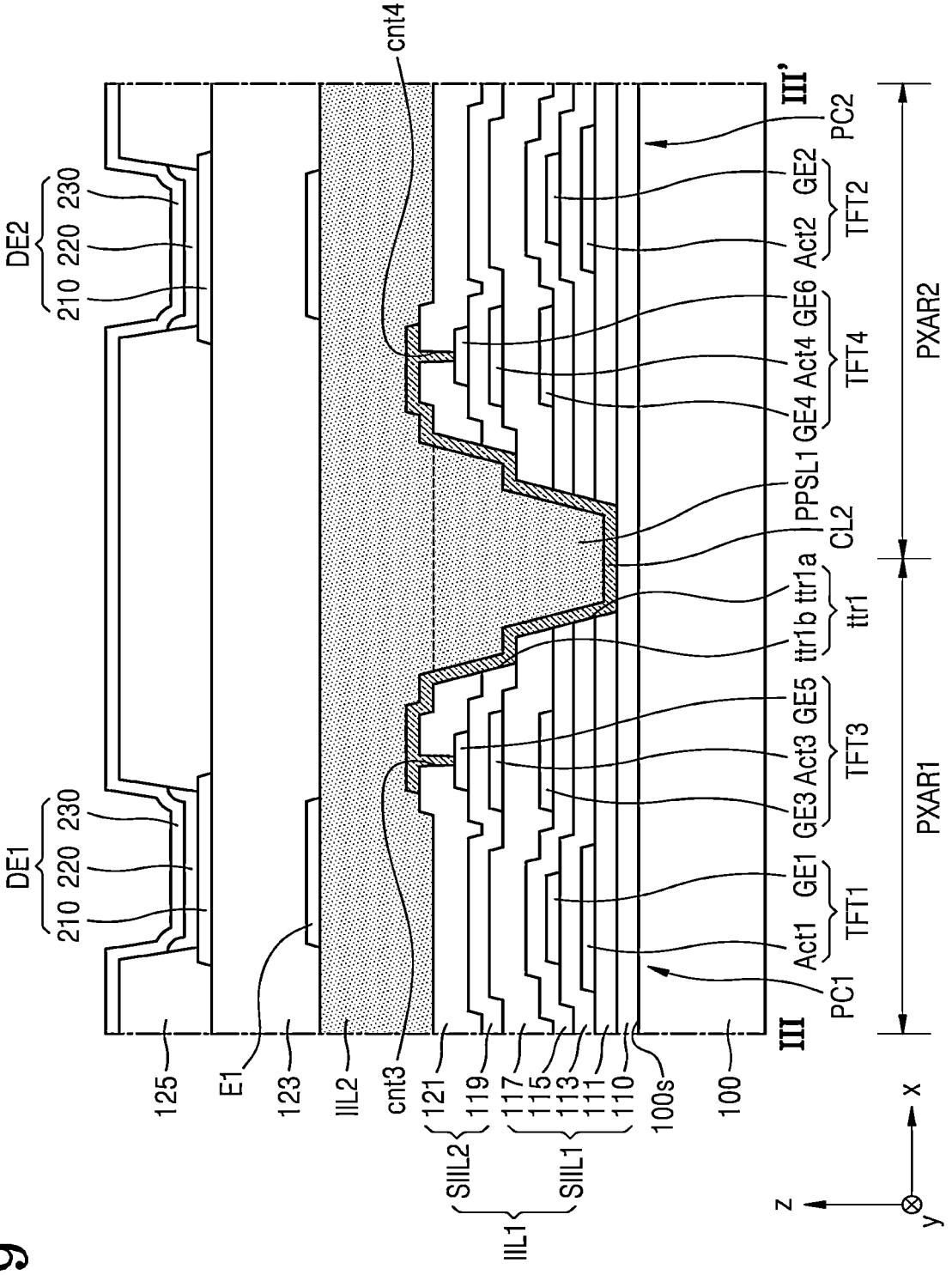
FIG. 9 is an enlarged cross-sectional view of an example of a portion of the display apparatus in FIG. 7, taken along line III-Ill' in FIG. 7.
Figure 10:
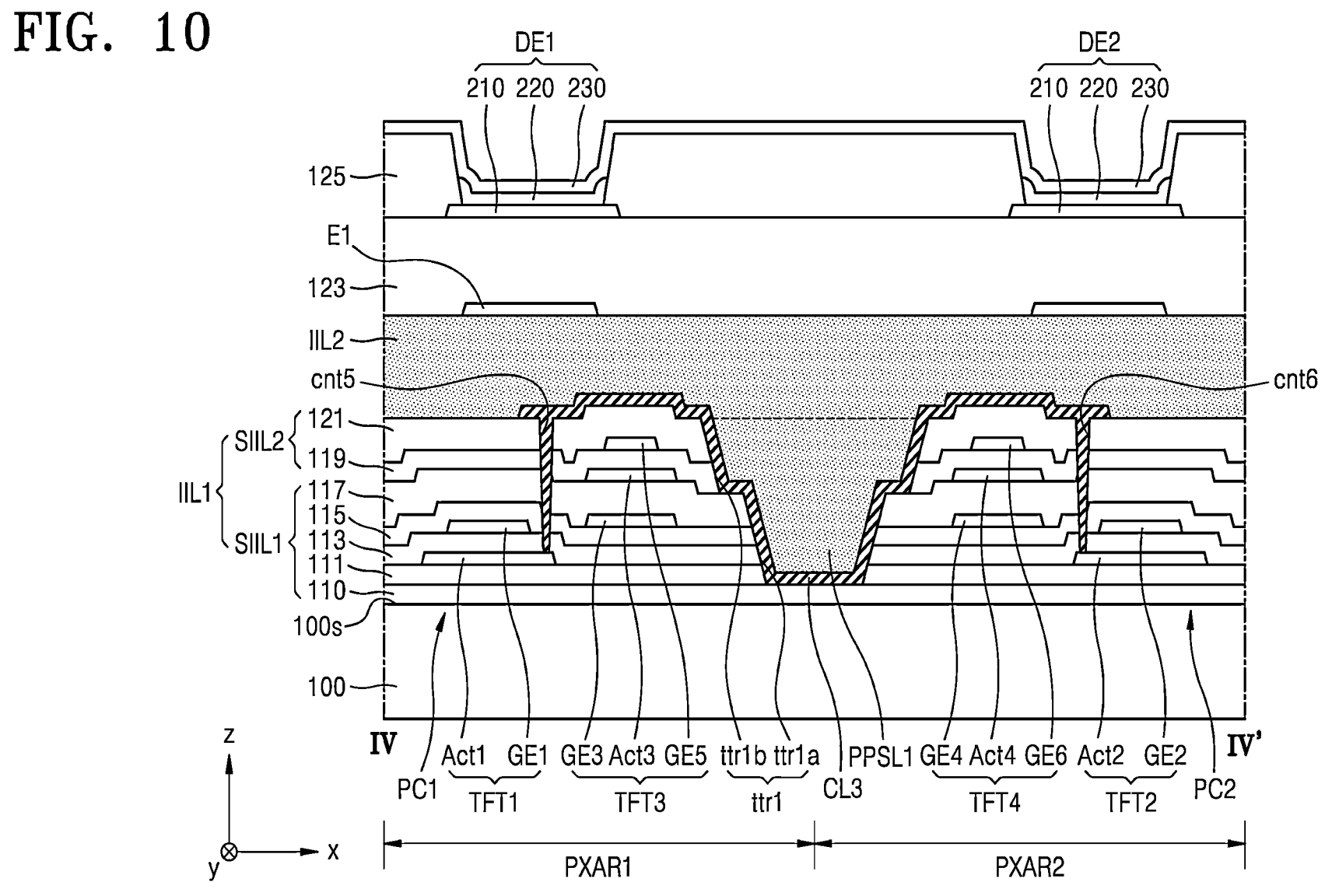
Figure 12:
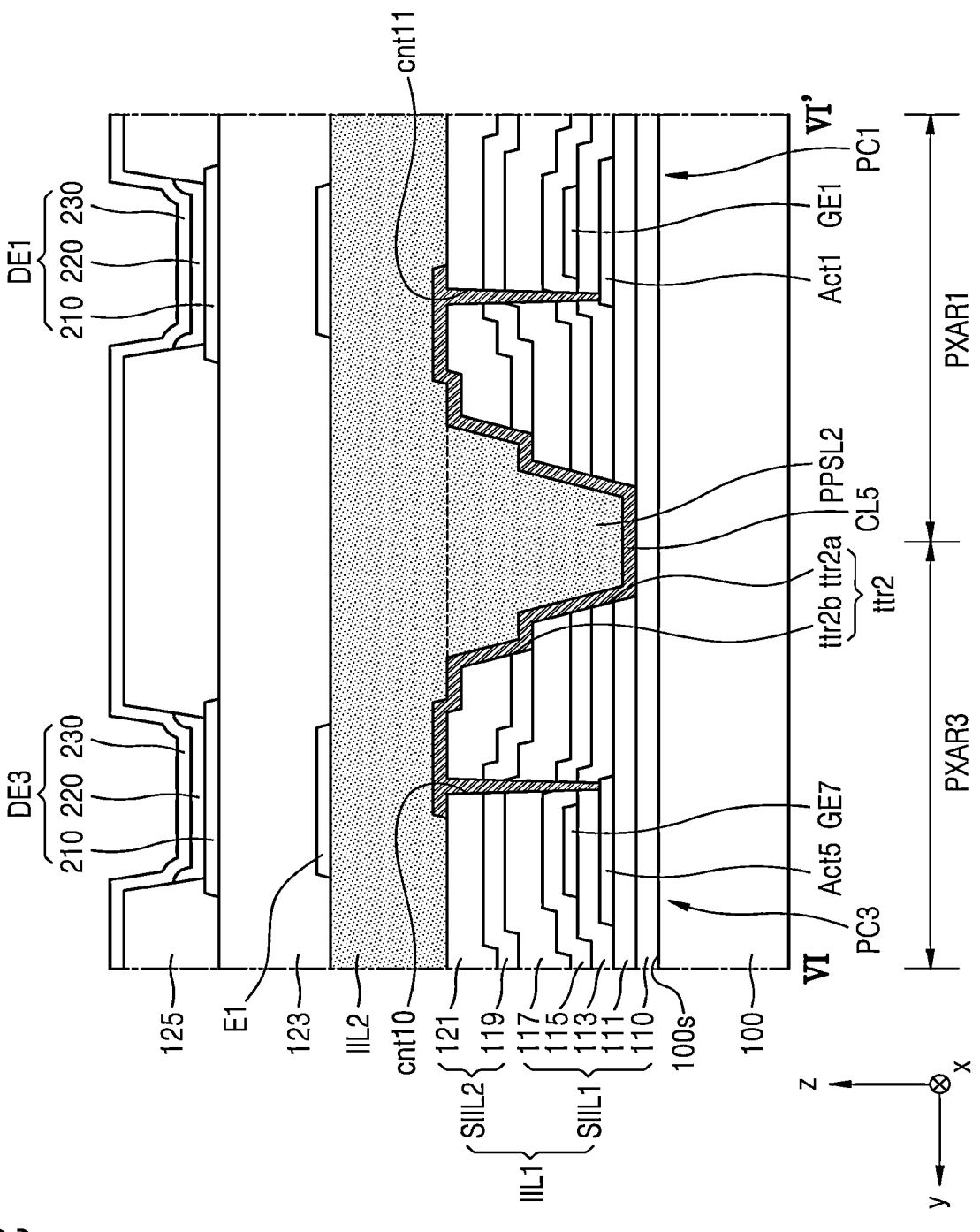
FIG. 12 is an enlarged cross-sectional view of an example of a portion of the display apparatus in FIG. 7, taken along line VI-VI' in FIG. 7.

Various pixel circuits may be respectively arranged in the pixel areas PXAR. Each of the pixel circuits may include at least one transistor, and the at least one transistor may include a semiconductor layer and a gate electrode. The first to fifth conductive lines CL1, CL2, CL3, CL4, and CL5 may connect the pixel circuits respectively arranged in the different pixel areas PXAR, to each other. As an example, the first and second conductive lines CL1 and CL2 may connect the gate electrodes respectively arranged in different pixel areas PXAR to each other as shown in FIGS. 8 and 9 described below. That is, the first and second conductive lines CL1 and CL2 may connect the different pixel areas PXAR to each other, at the gate electrodes respectively arranged such pixel areas PXAR. The third to fifth conductive lines CL3, CL4, and CL5 may connect the semiconductor layers respectively arranged in different pixel areas PXAR to each other as shown in FIGS. 10 and 12 described below. That is, third to fifth conductive lines CL3, CL4, and CL5 may connect the different pixel areas PXAR to each other, at the semiconductor layers respectively arranged such pixel areas PXAR. The first to fifth conductive lines CL1, CL2, CL3, CL4, and CL5 may include a conductive material including molybdenum (Mo), aluminum (Al), copper (Cu), and titanium (Ti) and have a single-layer or a multi-layer including the above materials. As an example, the first to fifth conductive lines CL1, CL2, CL3, CL4, and CL5 may have a multi-layered structure of Ti/Al/Ti.

FIG. 8 is a cross-sectional view of an example of a portion of the display apparatus in FIG. 7, taken along line II-II' in FIG. 7.

Referring to FIG. 8, the first pixel area PXAR1 and the second pixel area PXAR2 adjacent to each other in the first direction (e.g., the ±x direction) may be defined in the substrate 100.

The first insulating layer IIL1 disposed on the substrate 100 may include a first sub-insulating layer SIIL1 and a second sub-insulating layer SIIL2 which is on the first sub-insulating layer SIIL1. The first sub-insulating layer SIIL1 may include a buffer layer 111, a first gate insulating layer 113, a second gate insulating layer 115, and a first interlayer insulating layer 117, and the second sub-insulating layer SIIL2 may include a third gate insulating layer 119 and a second interlayer insulating layer 121.

The first insulating layer IIL1 may include (or define) a first trench ttr1 corresponding to the boundary between the first pixel area PAR1 and the second pixel area PAR2. A lateral surface of the first insulating layer IIL1 defining the first trench ttr1 may include at least one step difference. The at least one step difference may have an inclined surface forming a preset angle with respect to the upper surface 100s of the substrate 100. A lateral surface of the first insulating layer IIL1 defining the first trench ttr1 may include a stair shape.

In an embodiment, the first sub-insulating layer SIIL1 may include a first lateral surface SKI s defining a first portion ttr1a of the first trench ttr1, and the second sub-insulating layer SIIL2 may include a second lateral surface SIIL2s defining a second portion ttr1b of the first trench ttr1. In a plan view, the second lateral surface SIIL2s of the second sub-insulating layer SIIL2 may be located outside the first lateral surface SIIL1s of the first sub-insulating layer SIIL1, in a direction along the substrate 100.

In an embodiment, an angle (e.g., an internal angle) formed by the first lateral surface SKI s of the first sub-insulating layer SIIL1 and the upper surface 100s of the substrate 100 may be an acute angle. An angle (e.g., an internal angle) formed by the second lateral surface SIIL2s of the second sub-insulating layer SIIL2 and the upper surface 100s of the substrate 100 may be an acute angle.

In an embodiment, a width of the first portion ttr1a of the first trench ttr1 in the first direction (e.g., the ±x direction) may be less than a width of the second portion ttr1b of the first trench ttr1 in the first direction (e.g., the ±x direction). That is, the width of the first portion ttr1a of the first trench ttr1 in the first direction (e.g., a maximum width in the ±x direction) may be less than a width of the second portion ttr1b of the first trench ttr1 in the first direction (e.g., a minimum width in the ±x direction), without being limited thereto.

Though it is shown in FIG. 8 that the lateral surface of the first insulating layer IIL1 defining the first trench ttr1 includes at least one step difference, and the at least one step difference has an inclined surface forming a preset angle with respect to the upper surface 100s of the substrate 100, the lateral surface of the first insulating layer IIL1 defining the first trench ttr1 may have the same shape as the shape of the first insulating layer IL1 shown in FIG. 1 or have the same shape as the shape of the first insulating layer IL1 shown in FIG. 3 in another embodiment.

The first pixel circuit PC1 may be arranged in the first pixel area PXAR1, and the second pixel circuit PC2 may be arranged in the second pixel area PXAR2. The first pixel circuit PC1 may include a first transistor TFT1 and a third transistor TFT3, and the second pixel circuit PC2 may include a second transistor TFT2 and a fourth transistor TFT4. The first transistor TFT1 may include a first semiconductor layer Act1 and a first gate electrode GE1, the second transistor TFT2 may include a second semiconductor layer Act2 and a second gate electrode GE2, the third transistor TFT3 may include a third semiconductor layer Act3, a third gate electrode GE3, and a fifth gate electrode GE5, and the fourth transistor TFT4 may include a fourth semiconductor layer Act4, a fourth gate electrode GE4, and a sixth gate electrode GE6.

In an embodiment, the conduction type of the first transistor TFT1 may be opposite to the conduction type of the third transistor TFT3. The conduction type of the second transistor TFT2 may be opposite to the conduction type of the fourth transistor TFT4. The conduction type of the first transistor TFT1 may be the same as the conduction type of the second transistor TFT2, and the conduction type of the third transistor TFT3 may be the same as the conduction type of the fourth transistor TFT4.

In an embodiment, the first semiconductor layer Act1 and the second semiconductor layer Act2 may include a silicon semiconductor material, and the third semiconductor layer Act3 and the fourth semiconductor layer Act4 may include an oxide semiconductor material.

The first pixel separation layer PPSL1 may be buried in the first trench ttr1. At least a portion of the first conductive line CL1 may be arranged between the first insulating layer IIL1 and the first pixel separation layer PPSL1. The first conductive line CL1 may extend substantially in the first direction (e.g., the ±x direction) along the upper surface of the first insulating layer IIL1 and the first trench ttr1. The first conductive line CL1 may extend substantially in the first direction (e.g., the ±x direction) along the at least one step difference of the lateral surface (e.g., the sidewall) of the first insulating layer IIL1. The first conductive line CL1 may partially have a stair shape. In the case where the first conductive line CL1 extends along the at least one step difference, the thickness (or length) of the first conductive line CL1 in a thickness direction (e.g., a ±z direction) of the substrate 100 may be reduced. When the thickness of the first conductive line CL1 in the thickness direction (e.g., the ±z direction) of the substrate 100 is reduced, the amount of the first conductive line CL1 spreading in two opposite sides (e.g., opposite directions) in a plan view is reduced. Thus, unintentional connection to an adjacent different line (e.g., the second conductive line CL2 in FIG. 7) may be prevented.

In an embodiment, the first conductive line CL1 may extend substantially in the first direction (e.g., the ±x direction) along the first trench ttr1 to transfer a first signal to the first pixel circuit PC1 and the second pixel circuit PC2. The first signal may be one of a scan signal Sgw, an emission control signal Sem, and a next scan signal Sgb in FIG. 6. The first conductive line CL1 may connect the first gate electrode GE1 of the first transistor TFT1 to the second gate electrode GE2 of the second transistor TFT2. The first conductive line CL1 may be connected to the first gate electrode GE1 of the first transistor TFT1 through a first contact hole cnt1 formed in the first insulating layer IIL1 and connected to the second gate electrode GE2 of the second transistor TFT2 through a second contact hole cnt2 formed in the first insulating layer IIL1. The first and second transistors TFT1 and TFT2 may be turned on in response to the first signal.

Hereinafter, the structure included in the display apparatus 1 is described more specifically according to a stacking order.

The substrate 100 may include glass or a polymer resin. The polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multi-layered structure including a layer that includes the polymer resin and an inorganic layer (not shown).

The barrier layer 110 may be disposed on the substrate 100. The barrier layer 110 may be configured to prevent or reduce impurities from below the substrate 100, penetrating to the first semiconductor layer Act1 and the second semiconductor layer Act2. The barrier layer 110 may include an inorganic material, an organic material, or an organic/inorganic composite material, and include a single layer or a multi-layer including an inorganic material and an organic material, the inorganic material including oxide or nitride.

The buffer layer 111 may be disposed on the barrier layer 110. The buffer layer 111 may reduce or block penetration of foreign materials, moisture, or external air from below the substrate 100, to layers thereabove, and provide a flat surface along the substrate 100. The buffer layer 111 may include an inorganic material, an organic material, or an organic/inorganic composite material, and include a single layer or a multi-layer including an inorganic material and an organic material, the inorganic material including oxide or nitride.

The first insulating layer IIL1 may be disposed on the buffer layer 111. The first insulating layer IIL1 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The pixel separation layer PPSL1 disposed inside the first trench ttr1 of the first insulating layer IIL1 may include a single layer or a multi-layer including an organic material. As an example, the pixel separation layer PPSL1 may include a general-purpose polymer, such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The first semiconductor layer Act1 and the second semiconductor layer Act2 may be disposed on the buffer layer 111. The first semiconductor layer Act1 and the second semiconductor layer Act2 may be disposed in a same layer as each other. As being in a same layer, elements may be formed (provided) in a same process and/or as including a same material, elements may be respective portions (patterns) of a same material layer, elements may be on a same layer by forming an interface with a same underlying or overlying layer, elements may be coplanar with each other, etc., without being limited thereto. The first semiconductor layer Act1 and the second semiconductor layer Act2 may include amorphous silicon or polycrystalline silicon. The first semiconductor layer Act1 and the second semiconductor layer Act2 may include a channel region, a drain region, and a source region, the drain region and the source region being on two opposite sides of the channel region. The first semiconductor layer Act1 and the second semiconductor layer Act2 may include a single layer or a multi-layer.

The first gate insulating layer 113 may be disposed on the buffer layer 111 to cover the first semiconductor layer Act1 and the second semiconductor layer Act2. The first gate electrode GE1 and the second gate electrode GE2 may be disposed on the first gate insulating layer 113. The first gate electrode GE1 and the second gate electrode GE2 may be disposed in a same layer as each other. The first gate electrode GE1 and the second gate electrode GE2 may each include a conductive material including molybdenum (Mo), aluminum (Al), copper (Cu), and titanium (Ti) and have a single-layered structure or a multi-layered structure including the above materials. As an example, the first gate electrode GE1 and the second gate electrode GE2 may each include a Mo single layer.

The second gate insulating layer 115 may be disposed on the first gate insulating layer 113 to cover the first gate electrode GE1 and the second gate electrode GE2. The third gate electrode GE3 and the fourth gate electrode GE4 may be disposed on the second gate insulating layer 115, and may be in a same layer as each other. The third gate electrode GE3 and the fourth gate electrode GE4 may each include a conductive material including molybdenum (Mo), aluminum (Al), copper (Cu), and titanium (Ti) and have a single-layered structure or a multi-layered structure including the above materials. As an example, the third gate electrode GE3 and the fourth gate electrode GE4 may each include a Mo single layer.

The first interlayer insulating layer 117 may be disposed on the second gate insulating layer 115 to cover the third gate electrode GE3 and the fourth gate electrode GE4. The third semiconductor layer Act3 and the fourth semiconductor layer Act4 may be disposed on the first interlayer insulating layer 117, and may be in a same layer as each other. The third semiconductor layer Act3 and the fourth semiconductor layer Act4 may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

The third gate insulating layer 119 may be disposed on the first interlayer insulating layer 117 to cover third semiconductor layer Act3 and the fourth semiconductor layer Act4. The fifth gate electrode GE5 and the sixth gate electrode GE6 may be disposed on the third gate insulating layer 119, and may be in a same layer as each other. The fifth gate electrode GE5 and the sixth gate electrode GE6 may each include a conductive material including molybdenum (Mo), aluminum (Al), copper (Cu), and titanium (Ti) and have a single-layered structure or a multi-layered structure including the above materials. As an example, the fifth gate electrode GE5 and the sixth gate electrode GE6 may each include a Mo single layer.

The second interlayer insulating layer 121 may be disposed on the third gate insulating layer 119 to cover the fifth gate electrode GE5 and the sixth gate electrode GE6. The first conductive line CL1 may be disposed on the second interlayer insulating layer 121. The first conductive line CL1 may be respectively connected to the first and second gate electrodes GE1 and GE2, through the first and second contact holes cnt1 and cnt2 formed in the second gate insulating layer 115, the first interlayer insulating layer 117, the third gate insulating layer 119, and the second interlayer insulating layer 121. The first conductive line CL1 may include a conductive material including molybdenum (Mo), aluminum (Al), copper (Cu), and titanium (Ti) and have a single-layered structure or a multi-layered structure including the above materials. As an example, the first conductive line CL1 may have a multi-layered structure of Ti/Al/Ti.

The second insulating layer IIL2 may be disposed on the second insulating layer 121 to cover first conductive line CL1. The second insulating layer IIL2 may include a single layer or a multi-layer including an organic material and provide a flat upper surface. The second insulating layer IIL2 may include a general-purpose polymer, such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

In an embodiment, the second insulating layer IIL2 may be provided as one body with the first pixel separation layer PPSL1.

A first electrode E1 may be disposed on the second insulating layer IIL2. The first electrode E1 may include a conductive material including molybdenum (Mo), aluminum (Al), copper (Cu), and titanium (Ti) and have a single-layered structure or a multi-layered structure including the above materials. As an example, the first electrode E1 may have a multi-layered structure of Ti/Al/Ti.

A third insulating layer 123 may be disposed on the second insulating layer IIL2 to cover the first electrode E1. The third insulating layer 123 may include a single layer or a multi-layer including an organic material and provide a flat upper surface. The third insulating layer 123 may include a general-purpose polymer, such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

First and second display elements DE1 and DE2 may be disposed on the third insulating layer 123. The first display element DE1 may be arranged in the first pixel area PXAR1, and the second display element DE2 may be arranged in the second pixel area PXAR2. The first and second display elements DE1 and DE2 may be organic light-emitting diodes OLED. Each of the first and second display elements DE1 and DE2 may include a pixel electrode 210, an intermediate layer 220, and an opposite electrode 230, the intermediate layer 220 including an organic emission layer. Though not shown in FIG. 8, each of the first and second display elements DE1 and DE2 may be connected to a respective pixel circuit, through at least one contact hole formed in the third insulating layer 123 and the like.

The pixel electrode 210 may be a (semi) light-transmissive electrode or a reflective electrode. In an embodiment, the pixel electrode 210 may include a reflective layer and a transparent or semi-transparent electrode layer on the reflective layer, where the reflective layer includes at least one of Ag, Mg, Al, Pt, Pd, Au, Ni, Nd, Ir, Cr, and compound thereof. The transparent or semi-transparent electrode layer may include at least one of indium tin oxide (ITO), indium zinc oxide (IZO), zinc oxide (ZnO), indium oxide ($In_2O_3$), indium gallium oxide (IGO), and aluminum zinc oxide (AZO). In an embodiment, the pixel electrode 210 may include ITO/Ag/ITO.

In the display area DA of the substrate 100, a pixel-defining layer 125 may be disposed on the third insulating layer 123. The pixel-defining layer 125 may cover the edges of the pixel electrode 210 and include an opening exposing the central portion of the pixel electrode 210, to outside the pixel-defining layer 125. An emission area (e.g., light emission area) of each of the first and second display elements DE1 and DE2 may be defined by (or correspond to) the opening.

The pixel-defining layer 125 may prevent arcs (e.g., electrical arcs) and the like from occurring at the edges of each pixel electrode 210, by increasing a distance between the edges of each pixel electrode 210 and the opposite electrode 230 which is over the pixel electrode 210 along the thickness direction.

The pixel-defining layer 125 may include an organic insulating material, such as polyimide, an acrylic resin, benzocyclobutene, a phenolic resin, and the like, and be formed (or provided) by using spin coating and the like. The pixel-defining layer 125 may include an organic insulating material. Alternatively, the pixel-defining layer 125 may include an inorganic insulating material, such as silicon nitride, silicon oxynitride, or silicon oxide. Alternatively, the pixel-defining layer 125 may include an organic insulating material and an inorganic insulating material. In an embodiment, the pixel-defining layer 125 may include a light-blocking material and be provided in black. The light-blocking material may include carbon black, carbon nanotubes, a resin or paste including black dye, metal particles, for example, nickel, aluminum, molybdenum, and an alloy thereof, metal oxide particles (e.g., chrome oxide) or metal nitride particles (e.g., chrome nitride). In the case where the pixel-defining layer 125 includes a light-blocking material, external light reflection by metal structures arranged below the pixel-defining layer 125 may be reduced.

The intermediate layer 220 may be disposed inside the opening formed in the pixel-defining layer 125 and may include an organic emission layer. The organic emission layer may include an organic material including a fluorescent or phosphorous material emitting red, green, blue, or white light. The organic emission layer may include a polymer organic material or a low molecular weight organic material. Functional layers may be selectively further arranged under and on the organic emission layer, the functional layers including a hole transport layer (HTL), a hole injection layer (HIL), an electron transport layer (ETL), or an electron injection layer (EIL).

The opposite electrode 230 may be a light-transmissive electrode or a reflective electrode. In an embodiment, the opposite electrode 230 may be a transparent or semi-transparent electrode and may include a metal thin film including Li, Ca, LiF/Ca, LiF/Al, Al, Ag, Mg, or compound thereof and having a small work function. In addition, a transparent conductive oxide (TCO) layer, such as ITO, IZO, ZnO, or $In_2O_3$, may be further arranged on the metal thin film. The opposite electrode 230 may be arranged over the display area DA and disposed on the intermediate layer 220 and the pixel-defining layer 125. The opposite electrode 230 may be formed as one body over the first and second display elements DE1 and DE2 to commonly correspond to each of the pixel electrodes 210 spaced apart from each other along the third insulating layer 123.

Since the first and second display elements DE1 and DE2 may be easily damaged by external moisture, oxygen or the like, an encapsulation layer (not shown) may cover and protect the first and second display elements DE1 and DE2. The encapsulation layer may cover the display area DA and extend to at least a portion of the peripheral area PA. The encapsulation layer may include a first inorganic encapsulation layer, an organic encapsulation layer, and a second inorganic encapsulation layer arranged along the thickness direction.

FIG. 9 is a cross-sectional view of an example of a portion of the display apparatus 1 in FIG. 7, taken along line III-Ill' in FIG. 7. In FIG. 9, the same reference numerals as those of FIG. 8 denote the same members, and thus, repeated descriptions thereof are omitted.

Referring to FIG. 9, at least a portion of the second conductive line CL2 may be arranged between the first insulating layer IIL1 and the first pixel separation layer PPSL1. The second conductive line CL2 may extend substantially in the first direction (e.g., the ±x direction) along the upper surface of the first insulating layer IIL1 and the first trench ttr1. The second conductive line CL2 may extend substantially in the first direction (e.g., the ±x direction) along the at least one step difference of the lateral surface of the first insulating layer IIL1. The second conductive line CL2 may partially have a stair shape. In the case where the second conductive line CL2 extends along the at least one step difference, the thickness of the second conductive line CL2 in a thickness direction (e.g., the ±z direction) of the substrate 100 may be reduced. When the thickness of the second conductive line CL2 in the thickness direction (e.g., the ±z direction) of the substrate 100 is reduced, the amount of the second conductive line CL2 spreading in two opposite sides in a plan view is reduced Thus, unintentional connection to an adjacent different line (e.g., the first conductive line CL1 or the third conductive line CL3 in FIG. 7) may be prevented.

In an embodiment, the second conductive line CL2 may extend substantially in the first direction (e.g., the ±x direction) along the first trench ttr1 to transfer a second signal to the first pixel circuit PC1 and the second pixel circuit PC2. The second signal may be one of a compensation signal Sgc and an initialization signal Sgi in FIG. 6. Referring to FIGS. 8 and 9, together with FIG. 7, where the first conductive line CL1 extends along the first trench ttr1 and transfers a first signal to the first pixel circuit PC1 and the second pixel circuit PC2, the second conductive line extends along a same first trench ttr1 and transfers a second signal different from the first signal, to the first pixel circuit PC1 and the second pixel circuit PC2. That is, the first trench ttr1 in FIG. 7 may be continuous along the ±y direction, without being limited thereto. In an embodiment, a plurality of trench portions respectively corresponding to the first to fourth conductive lines CL1 to CL4, may be defined spaced apart from each other along the ±y direction.

The second conductive line CL2 may connect the fifth gate electrode GE5 of the third transistor TFT3 to the sixth gate electrode GE6 of the fourth transistor TFT4. The second conductive line CL2 may be connected to the fifth gate electrode GE5 of the third transistor TFT3 through a third contact hole cnt3 formed in the first insulating layer IIL1 and connected to the sixth gate electrode GE6 of the fourth transistor TFT4 through a fourth contact hole cnt4 formed in the first insulating layer IIL1. The third and fourth transistors TFT3 and TFT4 may be turned on in response to the second signal.

FIG. 10 is a cross-sectional view of an example of a portion of the display apparatus 1 in FIG. 7, taken along line IV-IV' in FIG. 7. In FIG. 10, the same reference numerals as those of FIG. 8 denote the same members, and thus, repeated descriptions thereof are omitted.

Referring to FIG. 10, at least a portion of the third conductive line CL3 may be arranged between the first insulating layer IIL1 and the first pixel separation layer PPSL1. The third conductive line CL3 may extend substantially in the first direction (e.g., the ±x direction) along the upper surface of the first insulating layer IIL1 and the first trench ttr1. The third conductive line CL3 may extend substantially in the first direction (e.g., the ±x direction) along the at least one step difference of the lateral surface of the first insulating layer IIL1. The third conductive line CL3 may partially have a stair shape. In the case where the third conductive line CL3 extends along the at least one step difference, the thickness of the third conductive line CL3 in a thickness direction (e.g., the ±z direction) of the substrate 100 may be reduced. When the thickness of the third conductive line CL3 in the thickness direction (e.g., the ±z direction) of the substrate 100 is reduced, the amount of the third conductive line CL3 spreading in two opposite sides in a plan view is reduced, and thus, unintentional connection to an adjacent different line (e.g., the second conductive line CL2 or the fourth conductive line CL4 in FIG. 7) may be prevented.

In an embodiment, the third conductive line CL3 may extend substantially in the first direction (e.g., the ±x direction) along the first trench ttr1 and be connected to the first pixel circuit PC1 and the second pixel circuit PC2. The third conductive line CL3 may connect the first semiconductor layer Act1 of the first transistor TFT1 to the second semiconductor layer Act2 of the second transistor TFT2. The third conductive line CL3 may be connected to the first semiconductor layer Act1 of the first transistor TFT1 through a fifth contact hole cnt5 formed in the first insulating layer IIL1 and connected to the second semiconductor layer Act2 of the second transistor TFT2 through a sixth contact hole cnt6 formed in the first insulating layer IIL1.

In an embodiment, the third conductive line CL3 may extend substantially in the first direction (e.g., the ±x direction) along the first trench ttr1 to transfer a first voltage to the first pixel circuit PC1 and the second pixel circuit PC2. The first voltage may be one of the initialization voltage Vint and the driving voltage ELVDD in FIG. 6.

Figure 11:
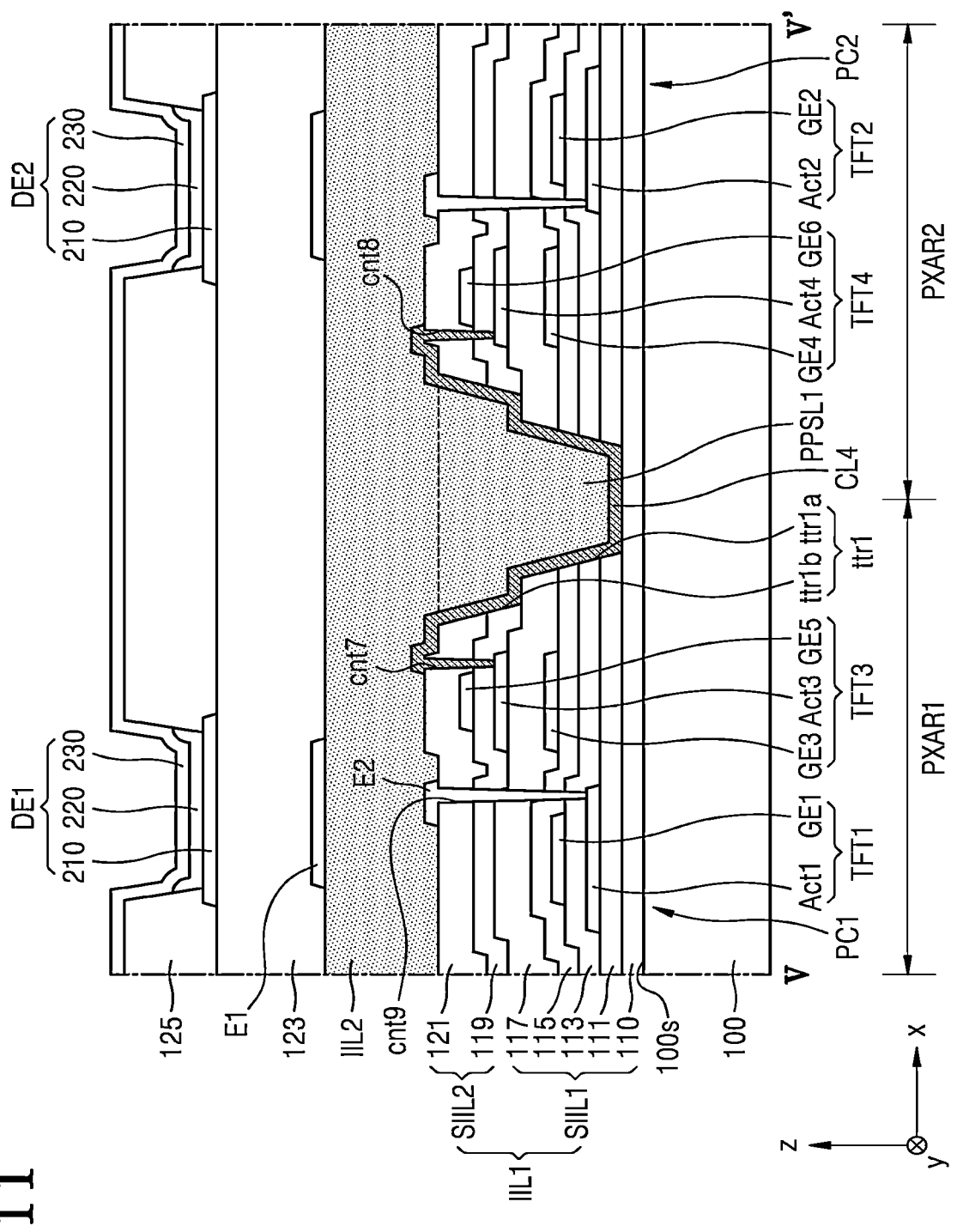
FIG. 11 is an enlarged cross-sectional view of an example of a portion of the display apparatus in FIG. 7, taken along line V-V in FIG. 7.

FIG. 11 is a cross-sectional view of an example of a portion of the display apparatus 1 in FIG. 7, taken along line V-V in FIG. 7. In FIG. 11, the same reference numerals as those of FIG. 8 denote the same members, and thus, repeated descriptions thereof are omitted.

Referring to FIG. 11, at least a portion of the fourth conductive line CL4 may be arranged between the first insulating layer IIL1 and the first pixel separation layer PPSL1. The fourth conductive line CL4 may extend substantially in the first direction (e.g., the ±x direction) along the upper surface of the first insulating layer IIL1 and the first trench ttr1. The fourth conductive line CL4 may extend substantially in the first direction (e.g., the ±x direction) along the at least one step difference of the lateral surface of the first insulating layer IIL1. The fourth conductive line CL4 may partially have a stair shape. In the case where fourth conductive line CL4 extends along the at least one step difference, the thickness of the fourth conductive line CL4 in a thickness direction (e.g., the ±z direction) of the substrate 100 may be reduced. When the thickness of the fourth conductive line CL4 in the thickness direction (e.g., the ±z direction) of the substrate 100 is reduced, the amount of the fourth conductive line CL4 spreading in two opposite sides in a plan view is reduced, and thus, unintentional connection to an adjacent different line (e.g., the third conductive line CL3 in FIG. 7) may be prevented.

In an embodiment, the fourth conductive line CL4 may extend substantially in the first direction (e.g., the ±x direction) along the first trench ttr1 and be connected to the first pixel circuit PC1 and the second pixel circuit PC2. The fourth conductive line CL4 may connect the third semiconductor layer Act3 of the third transistor TFT3 to the fourth semiconductor layer Act4 of the fourth transistor TFT4. The fourth conductive line CL4 may be connected to the third semiconductor layer Act3 of the third transistor TFT3 through a seventh contact hole cnt7 formed in the first insulating layer IIL1 and connected to the fourth semiconductor layer Act4 of the fourth transistor TFT4 through an eighth contact hole cnt8 formed in the first insulating layer IIL1.

In an embodiment, the fourth conductive line CL4 may extend substantially in the first direction (e.g., the ±x direction) along the first trench ttr1 to transfer a second voltage to the first pixel circuit PC1 and the second pixel circuit PC2. The second voltage may be the initialization voltage Vint of FIG. 6.

The display apparatus 1 may further include a second electrode E2 provided in plural, disposed on the first insulating layer IIL1. The second electrode E2 provided in plural may be respectively connected to the first and second semiconductor layers Act1 and Act2 through a ninth contact hole cnt9 formed in the first insulating layer IIL1. The second electrode E2 may include a conductive material including molybdenum (Mo), aluminum (Al), copper (Cu), and titanium (Ti) and have a single-layered structure or a multi-layered structure including the above materials. As an example, the second electrode E2 may have a multi-layered structure of Ti/Al/Ti.

FIG. 12 is a cross-sectional view of an example of a portion of the display apparatus 1 in FIG. 7, taken along line VI-VI' in FIG. 7. In FIG. 12, the same reference numerals as those of FIG. 8 denote the same members, and thus, repeated descriptions thereof are omitted.

Referring to FIG. 12, the first pixel area PXAR1 and the third pixel area PXAR3 adjacent to each other in the second direction (e.g., the ±y direction) may be defined in the substrate 100.

The first insulating layer IIL1 may include a second trench ttr2 corresponding to the boundary between the first pixel area PXAR1 and the third pixel area PXAR3. A lateral surface of the first insulating layer IIL1 defining the second trench ttr2 may include at least one step difference. The at least one step difference may have an inclined surface forming a preset angle with respect to the upper surface 100s of the substrate 100. A lateral surface of the first insulating layer IIL1 defining the second trench ttr2 may include a stair shape.

In an embodiment, in a plan view, the lateral surface of the second sub-insulating layer SIIL2 defining the second portion ttr2b of the second trench ttr2 may be located outside the lateral surface of the first sub-insulating layer SIIL1 defining the first portion ttr2a of the second trench ttr2.

In an embodiment, an angle formed by the lateral surface of the first sub-insulating layer SIIL1 defining the first portion ttr2a of the second trench ttr2 and the upper surface 100s of the substrate 100 may be an acute angle. An angle formed by the lateral surface of the second sub-insulating layer SIIL2 defining the second portion ttr2b of the second trench ttr2 and the upper surface 100s of the substrate 100 may be an acute angle.

In an embodiment, a width of the first portion ttr2a of the second trench ttr2 in the second direction (e.g., the ±y direction) may be less than a width of the second portion ttr2b of the second trench ttr2 in the second direction (e.g., the ±y direction).

Though it is shown in FIG. 12 that the lateral surface of the first insulating layer IIL1 defining the second trench ttr2 includes at least one step difference, and the at least one step difference has an inclined surface forming a preset angle with respect to the upper surface 100s of the substrate 100, the lateral surface of the first insulating layer IIL1 defining the second trench ttr2 may have the same shape as the shape of the first insulating layer IL1 shown in FIG. 1 or have the same shape as the shape of the first insulating layer IL1 shown in FIG. 3 in another embodiment.

A third pixel circuit PC3 and a third display element DE3 may be arranged in the third pixel area PXAR3. The third pixel circuit PC3 may include a fifth semiconductor layer Act5 and a seventh gate electrode GE7. The fifth semiconductor layer Act5 may include amorphous silicon or polycrystalline silicon. The seventh gate electrode GE7 may include a conductive material including molybdenum (Mo), aluminum (Al), copper (Cu), and titanium (Ti) and have a single-layered structure or a multi-layered structure including the above materials. As an example, the seventh gate electrode GE7 may include a single Mo layer. The third display element DE3 may include the pixel electrode 210, an intermediate layer 220, and an opposite electrode 230.

The second pixel separation layer PPSL2 may be buried in the second trench ttr2. At least a portion of the fifth conductive line CL5 may be arranged between the first insulating layer IIL1 and the second pixel separation layer PPSL2. The fifth conductive line CL5 may extend substantially in the second direction (e.g., the ±y direction) along the upper surface of the first insulating layer IIL1 and the second trench ttr2. The fifth conductive line CL5 may extend substantially in the second direction (e.g., the ±y direction) along the at least one step difference of the lateral surface of the first insulating layer IIL1. The fifth conductive line CL5 may partially have a stair shape. In the case where the fifth conductive line CL5 extends along the at least one step difference, the thickness of the fifth conductive line CL5 in a thickness direction (e.g., the ±z direction) of the substrate 100 may be reduced. When the thickness of the fifth conductive line CL5 in the thickness direction (e.g., the ±z direction) of the substrate 100 is reduced, the amount of the fifth conductive line CL5 spreading in two opposite sides in a plan view is reduced, and thus, unintentional connection to an adjacent different line may be prevented.

In an embodiment, the fifth conductive line CL5 may extend substantially in the second direction (e.g., the ±y direction) along the second trench ttr2 and connect the first semiconductor layer Act1 to the fifth semiconductor layer Act5. The fifth conductive line CL5 may be connected to the fifth semiconductor layer Act5 through a tenth contact hole cnt10 formed in the first insulating layer IIL1 and connected to the first semiconductor layer Act1 through an eleventh contact hole cnt11 formed in the first insulating layer IIL1.

Though description has been mainly made to the display apparatus to the point, the embodiment is not limited thereto.

As an example, a method of manufacturing a display apparatus to manufacture the display apparatus also falls within the scope of the disclosure.

Figure 13:
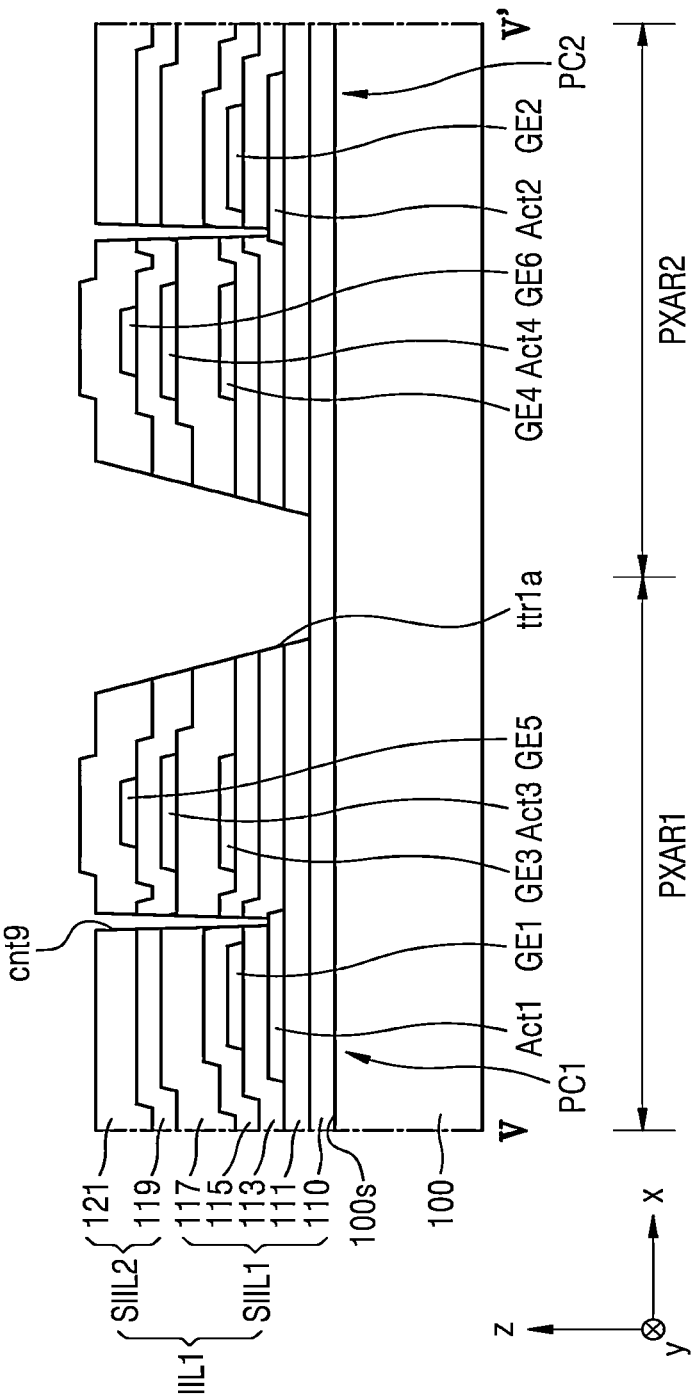
FIGS. 13 to 15 are schematic cross-sectional views showing a method of manufacturing (or providing) a display apparatus according to an embodiment.
Figure 14:
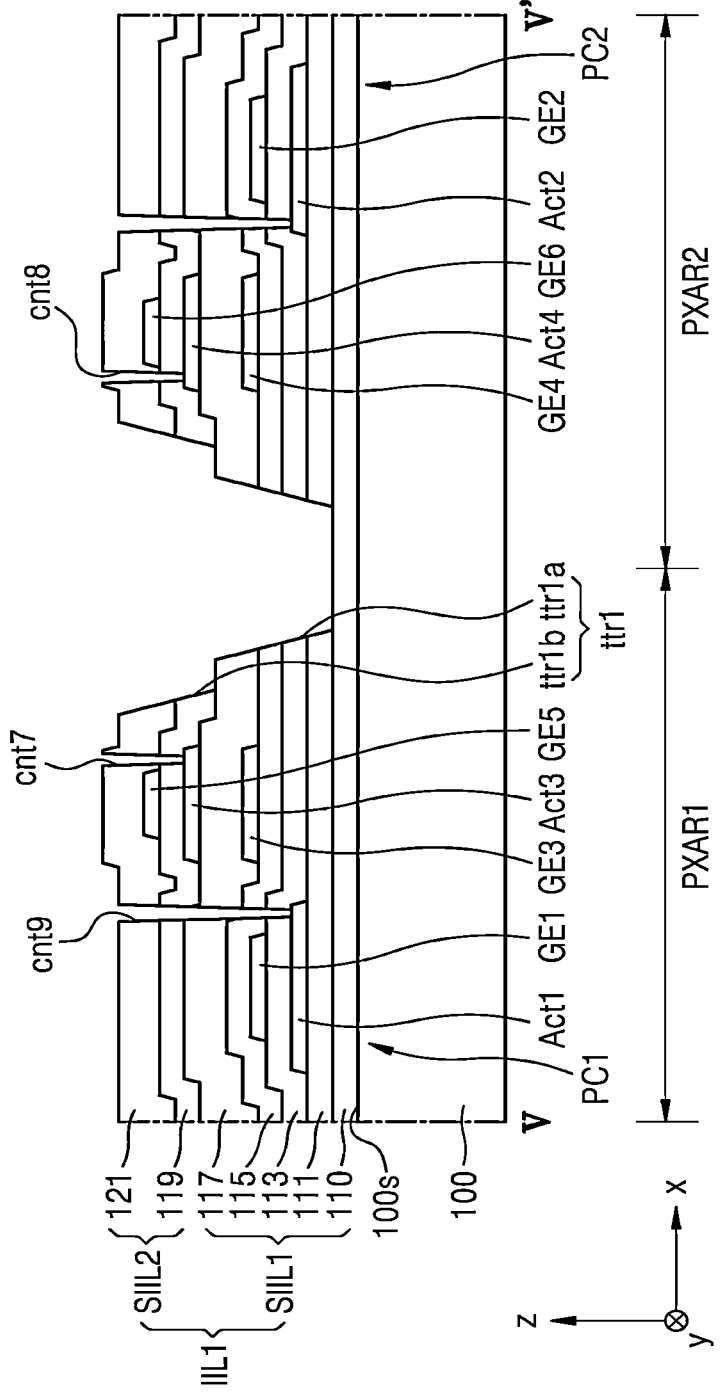
Figure 15:
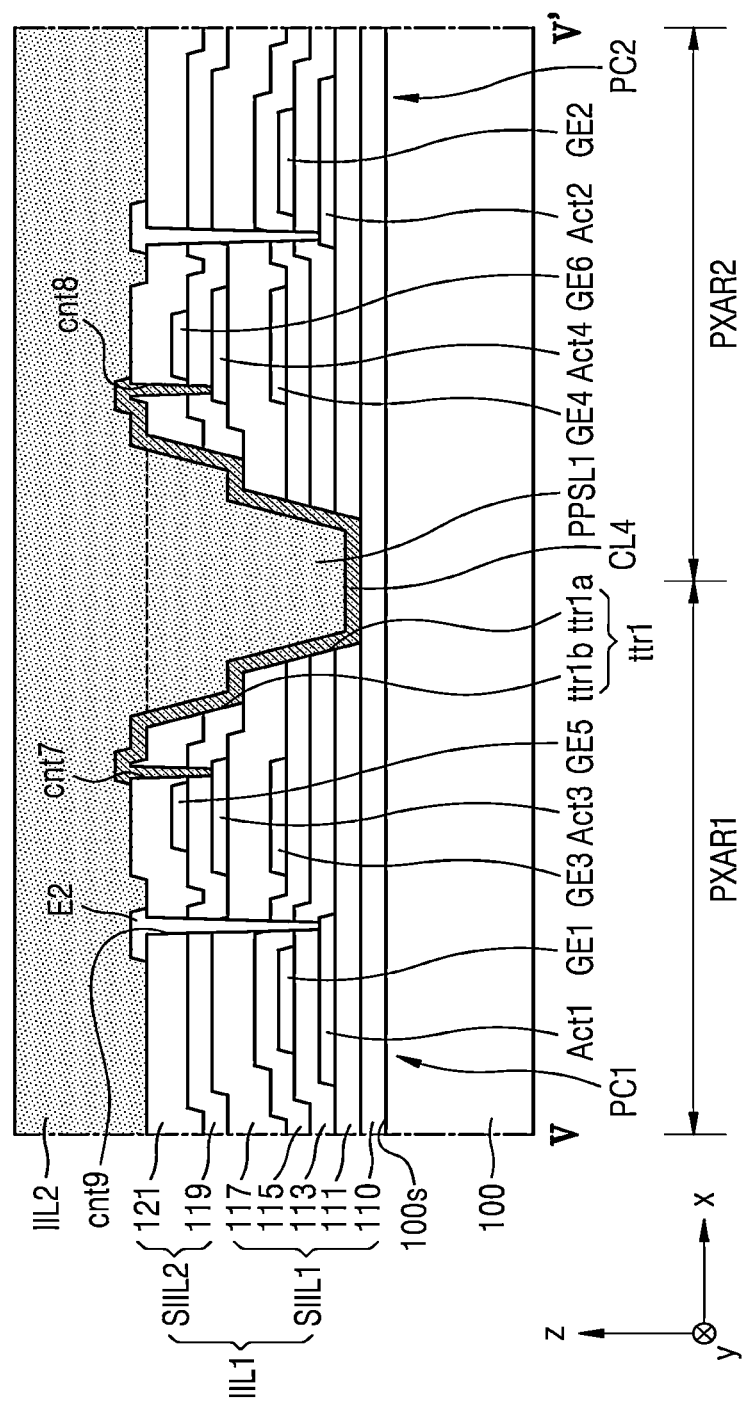

FIGS. 13 to 15 are schematic cross-sectional views showing a method of manufacturing (or providing) a display apparatus 1 according to an embodiment. FIGS. 13 to 15 shows the method of manufacturing a display apparatus 1 based on the cross-sectional view of the display apparatus shown in FIG. 11.

Referring to FIG. 13, the barrier layer 110, the first insulating layer IIL1, the first pixel circuit PC1, and the second pixel circuit PC2 are formed on the substrate 100. The first portion ttr1a (e.g., upper portion) of the first trench ttr1 is formed by etching a portion of the first insulating layer IIL1 corresponding to a boundary between the first pixel area PXAR1 and the second pixel area PXAR2. The first portion ttr1a of the first trench ttr1 may be formed or provided together with providing a plurality of the ninth contact hole cnt9 which expose at least a portion of the first semiconductor layer Act1 and the second semiconductor layer Act2, such as being simultaneously formed. An etching process of forming the first portion Uri a of the first trench ttr1 and the ninth contact hole cnt9 may be dry etching.

Referring to FIG. 14, the second portion ttr1b (e.g., the lower portion) of the first trench ttr1 is formed by etching another portion of the first insulating layer IIL1 corresponding to a boundary between the first pixel area PXAR1 and the second pixel area PXAR2, the another portion spaced apart from the portion described above. The second portion ttr1b of the first trench ttr1 is formed together while the seventh contact hole cnt7 and the eighth contact hole cnt8 are formed in the first insulating layer IIL1, where the seventh contact hole cnt7 exposes at least a portion of the third semiconductor layer Act3, and the eighth contact hole cnt8 exposes at least a portion of the fourth semiconductor layer Act4. An etching process of forming the second portion ttr1b of the first trench ttr1, the seventh contact hole cnt7, and the eighth contact hole cnt8 may be dry etching.

The first trench ttr1 may be formed by an operation of forming the first portion ttr1a that is narrow and deep and an operation of forming the second portion ttr1b that is wide and shallow.

Referring to FIG. 15, the second electrode E2 and the fourth conductive line CL4 are formed on the first insulating layer IIL1. The first pixel separation layer PPSL1 and the second insulating layer IIL2 are formed to cover the second electrode E2 and the fourth conductive line CL4.

Though not shown in FIG. 15, the first electrode E1, the third insulating layer 123, the pixel electrode 210, the pixel-defining layer 125, the intermediate layer 220, and the opposite electrode 230 are sequentially formed after the forming of the stacked structure shown in FIG. 15.

According to an embodiment, a high-resolution display apparatus which is flexible and robust against an external impact may be implemented. However, the scope of the disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a plurality of pixel areas including:
    a first pixel area comprising a first pixel circuit including a first transistor and a third transistor, and
    a second pixel area which is adjacent to the first pixel area along a first direction, the second pixel area comprising a second pixel circuit including a second transistor connected to the first transistor and a fourth transistor connected to the third transistor;
a first boundary defined between the first pixel area and the second pixel area;
a first insulating layer which is in the first pixel area and the second pixel area, the first insulating layer including:
    a first trench which is defined in the first insulating layer and corresponds to the first boundary defined between the first pixel area and the second pixel area,
    contacts holes which area defined in the first insulating layer and spaced apart from the first trench, and
    a lateral surface which defines the first trench;
a first pixel separation layer which is in the first trench, the first pixel separation layer including a material different from a material of the first insulating layer; and
a first conductive line which continuously extends between the first insulating layer and the first pixel separation layer, along the lateral surface which defines the first trench, and through a contact hole among the contact holes in the first insulating layer to directly connect the first transistor of the first pixel area to the second transistor of the second pixel area; and
a second conductive line which is spaced apart from the first conductive line along the first trench, continuously extends between the first insulating layer and the first pixel separation layer, along the lateral surface which defines the first trench, and through another contact hole among the contact holes to directly connect the third transistor of the first pixel area to the fourth transistor of the second pixel area.

2. The display apparatus of claim 1, wherein
the first insulating layer has an upper surface at the plurality of pixel areas, and
the first conductive line extends along the upper surface of the first insulating layer and into the first trench.

3. The display apparatus of claim 1, further comprising:
the first pixel circuit including a first semiconductor layer and a first gate electrode which is on the first semiconductor layer; and
the second pixel circuit including a second semiconductor layer and a second gate electrode which is on the second semiconductor layer, and
the contact holes including:
    a first contact hole exposing the first gate electrode to outside the first insulating layer, and
    a second contact hole exposing the second gate electrode to outside the first insulating layer,
wherein the first conductive line is directly connected to the first pixel circuit at the first gate electrode, through the first contact hole, together with being directly connected to the second pixel circuit at the second gate electrode, through the second contact hole.

4. The display apparatus of claim 1, further comprising:
a first semiconductor layer in the first pixel area; and
a second semiconductor layer in the second pixel area, and the contact holes including:
    a first contact hole exposing the first semiconductor layer to outside the first insulating layer, and a second contact hole exposing the second semiconductor layer to outside the first insulating layer, wherein the first conductive line is directly connected to the first semiconductor layer, through the first contact hole, together with being directly connected to the second semiconductor layer, through the second contact hole.

5. The display apparatus of claim 1, wherein the first insulating layer includes the lateral surface having a step.

6. The display apparatus of claim 5, wherein the first conductive line extends along the step of the lateral surface.

7. The display apparatus of claim 5, further comprising:
a substrate including the plurality of pixel areas, and
the first insulating layer and the first conductive line being in order from the substrate,
wherein the lateral surface is inclined with respect to the substrate.

8. The display apparatus of claim 1, further comprising:
a substrate including the plurality of pixel areas, and
the first insulating layer and the first conductive line being in order from the substrate, wherein
the first trench includes a first portion and a second portion which is further from the substrate than the first portion,
the first insulating layer includes:
a first sub-insulating layer including a first lateral surface of the lateral surface which defines the first portion of the first trench,
a second sub-insulating layer including a second lateral surface of the lateral surface which defines the second portion of the first trench, and
the second lateral surface of the second sub-insulating layer being outside the first lateral surface of the first sub-insulating layer, along the first direction.

9. The display apparatus of claim 8, wherein along the first direction, a first width of the first portion of the first trench is less than a second width of the second portion of the first trench.

10. The display apparatus of claim 8, wherein
the first lateral surface of the first sub-insulating layer forms a right angle or an acute angle with respect to the substrate, and
the second lateral surface of the second sub-insulating layer forms a right angle or an acute angle with respect to the substrate.

11. The display apparatus of claim 1, wherein the first insulating layer includes:
a first portion having a first thickness, and
a second portion which is further from a center of the first trench than the first portion, having a second thickness greater than the first thickness of the first portion.

12. The display apparatus of claim 1,
wherein
the first conductive line extends along the first trench and transfers a first signal to the first pixel circuit and the second pixel circuit, and
the second conductive line extends along the first trench and transfers a second signal different from the first signal, to the first pixel circuit and the second pixel circuit.

13. The display apparatus of claim 12, wherein
the first transistor is turned on in response to the first signal,
the third transistor is turned on in response to the second signal,
the second transistor is turned on in response to the first signal, the fourth transistor is turned on in response to the second signal, each of the first, second, third and fourth transistors has a conduction type among a p-type conduction and a n-type conduction, the conduction type of the first transistor is different from the conduction type of the third transistor, and the conduction type of the second transistor is different from the conduction type of the fourth transistor.

14. The display apparatus of claim 1, wherein
the plurality of pixel areas further includes a third pixel area adjacent to the first pixel area along a second direction which crosses the first direction,
a second boundary is defined between the first pixel area and the third pixel area,
the first insulating layer is further in the third pixel area,
a second trench is further defined in the first insulating layer and corresponds to the second boundary between the first pixel area and the third pixel area, and
the display apparatus further comprises:
a second pixel separation layer which is in the second trench, the second pixel separation layer including a material different from the material of the first insulating layer; and
a third conductive line which connects the first pixel area to the third pixel area, the third conductive line being between the first insulating layer and the second pixel separation layer.

15. The display apparatus of claim 14, wherein
the first insulating layer has an upper surface at the plurality of pixel areas, and
the third conductive line extends along the upper surface of the first insulating layer and into the second trench.

16. The display apparatus of claim 14, wherein the first insulating layer includes a lateral surface which defines the second trench and has a step.

17. The display apparatus of claim 1, further comprising:
a first semiconductor layer which is in the first pixel area and includes a material;
a second semiconductor layer which is in the second pixel area and includes a material;
a third semiconductor layer which is in the first pixel area and includes a material different from the material of the first semiconductor layer; and
a fourth semiconductor layer which is in the second pixel area and includes a material different from the material of the second semiconductor layer,
wherein
the first conductive line is directly connected to the first semiconductor layer of the first pixel area and is directly connected to the second semiconductor layer of the second pixel area, and
the second conductive line is directly connected to the third semiconductor layer of the first pixel area and is directly connected to the fourth semiconductor layer of the second pixel area.

18. The display apparatus of claim 17, wherein
the material of the first semiconductor layer and the second semiconductor layer includes a silicon semiconductor material, and
the material of the third semiconductor layer and the fourth semiconductor layer includes an oxide semiconductor material.

19. The display apparatus of claim 1, wherein the first pixel separation layer which is in the first trench, extends outside of the first trench to define a second insulating layer on the first insulating layer and covering the first conductive line.

20. The display apparatus of claim 1, wherein the first insulating layer includes an inorganic material, and the first pixel separation layer includes an organic material.

* * * * *